United States Patent
Lin et al.

(10) Patent No.: US 12,232,328 B2
(45) Date of Patent: *Feb. 18, 2025

(54) MEMORY DEVICES

(71) Applicant: Taiwan Semiconductor Manufacturing Company, Ltd., Hsinchu (TW)

(72) Inventors: Meng-Han Lin, Hsinchu (TW); Mauricio Manfrini, Hsinchu County (TW); Han-Jong Chia, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/296,385

(22) Filed: Apr. 6, 2023

(65) Prior Publication Data

US 2023/0255032 A1   Aug. 10, 2023

Related U.S. Application Data

(62) Division of application No. 17/155,093, filed on Jan. 22, 2021, now Pat. No. 11,647,636.

(60) Provisional application No. 63/040,001, filed on Jun. 17, 2020.

(51) Int. Cl.
| | | |
|---|---|---|
| H01L 29/20 | (2006.01) | |
| H01L 23/522 | (2006.01) | |
| H01L 23/528 | (2006.01) | |
| H01L 29/24 | (2006.01) | |
| H10B 51/20 | (2023.01) | |
| H10B 51/30 | (2023.01) | |

(52) U.S. Cl.
CPC ......... H10B 51/20 (2023.02); *H01L 23/5226* (2013.01); *H01L 23/5283* (2013.01); H01L 29/24 (2013.01); H10B 51/30 (2023.02)

(58) Field of Classification Search
CPC ........ H10B 51/20; H10B 51/30; H10B 51/50; H10B 43/10; H10B 43/20; H10B 43/50; H10B 51/10; H10B 51/40; H01L 23/5226; H01L 23/5283; H01L 29/24
See application file for complete search history.

(56) References Cited

U.S. PATENT DOCUMENTS

| | | | | |
|---|---|---|---|---|
| 10,121,553 B2* | 11/2018 | Harari | ................ | H01L 29/7926 |
| 11,647,636 B2* | 5/2023 | Lin | ................ | H10B 51/30 |
| | | | | 257/295 |
| 2011/0199804 A1* | 8/2011 | Son | ................ | H10B 43/27 |
| | | | | 365/51 |
| 2016/0027793 A1* | 1/2016 | Yip | ................ | H10B 43/10 |
| | | | | 257/773 |
| 2020/0035701 A1* | 1/2020 | Huang | ............... | H01L 29/40117 |
| 2021/0335802 A1* | 10/2021 | Lee | ................ | H01L 29/40117 |

* cited by examiner

*Primary Examiner* — Shouxiang Hu
(74) *Attorney, Agent, or Firm* — JCIPRNET

(57) ABSTRACT

A memory device includes a multi-layer stack including a plurality of first conductive lines and a plurality of second conductive lines. The first conductive lines are stacked on one another. The second conductive lines cross over the plurality of first conductive lines, wherein widths of the plurality of second conductive lines are increased as the plurality of second conductive lines become close to a middle portion of the multi-layer stack.

20 Claims, 38 Drawing Sheets

MEMORY DEVICES

CROSS-REFERENCE TO RELATED APPLICATION

This application is a divisional application of and claims the priority benefit of U.S. application Ser. No. 17/155,093, filed on Jan. 22, 2021, now allowed, which claims the priority benefit of U.S. provisional application Ser. No. 63/040,001, filed on Jun. 17, 2020. The entirety of each of the above-mentioned patent applications is hereby incorporated by reference herein and made a part of this specification.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers over a semiconductor substrate, and patterning the various material layers using lithography and etching techniques to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
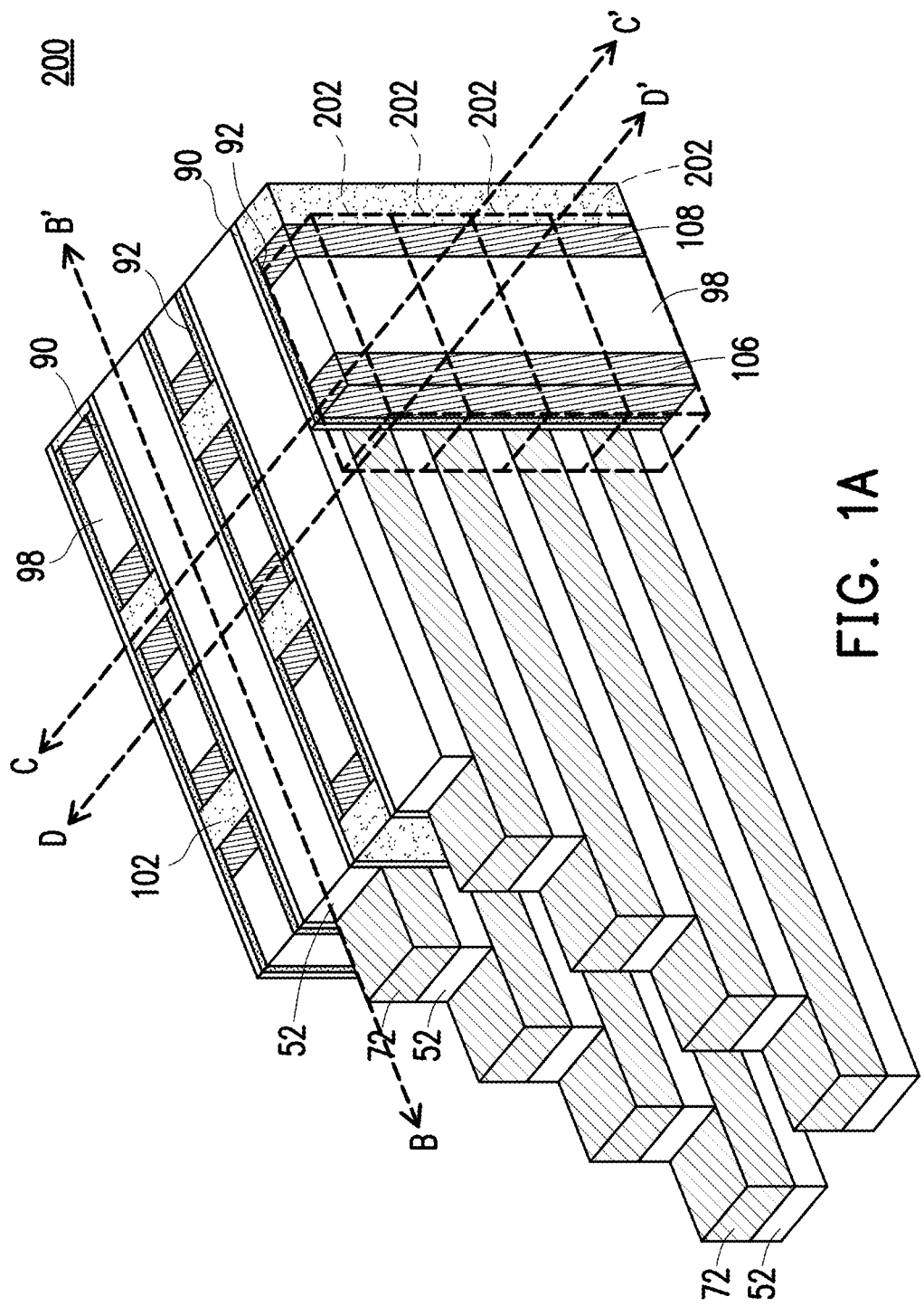
FIGS. 1A and 1B illustrate a simplified perspective view and a circuit diagram of a memory device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide a memory device such as a 3D memory device. In some embodiments, the 3D memory device is a ferroelectric field effect transistor (FeFET) memory circuit including a plurality of vertically stacked memory cells. In some embodiments, each memory cell is regarded as a FeFET that includes a word line region acting as a gate electrode, a bit line region acting as a first source/drain electrode, a source line region acting as a second source/drain electrode, a ferroelectric material acting as a gate dielectric, and an oxide semiconductor (OS) acting as a channel region. In some embodiments, each memory cell is regarded as a thin film transistor (TFT).

Figure 1B:
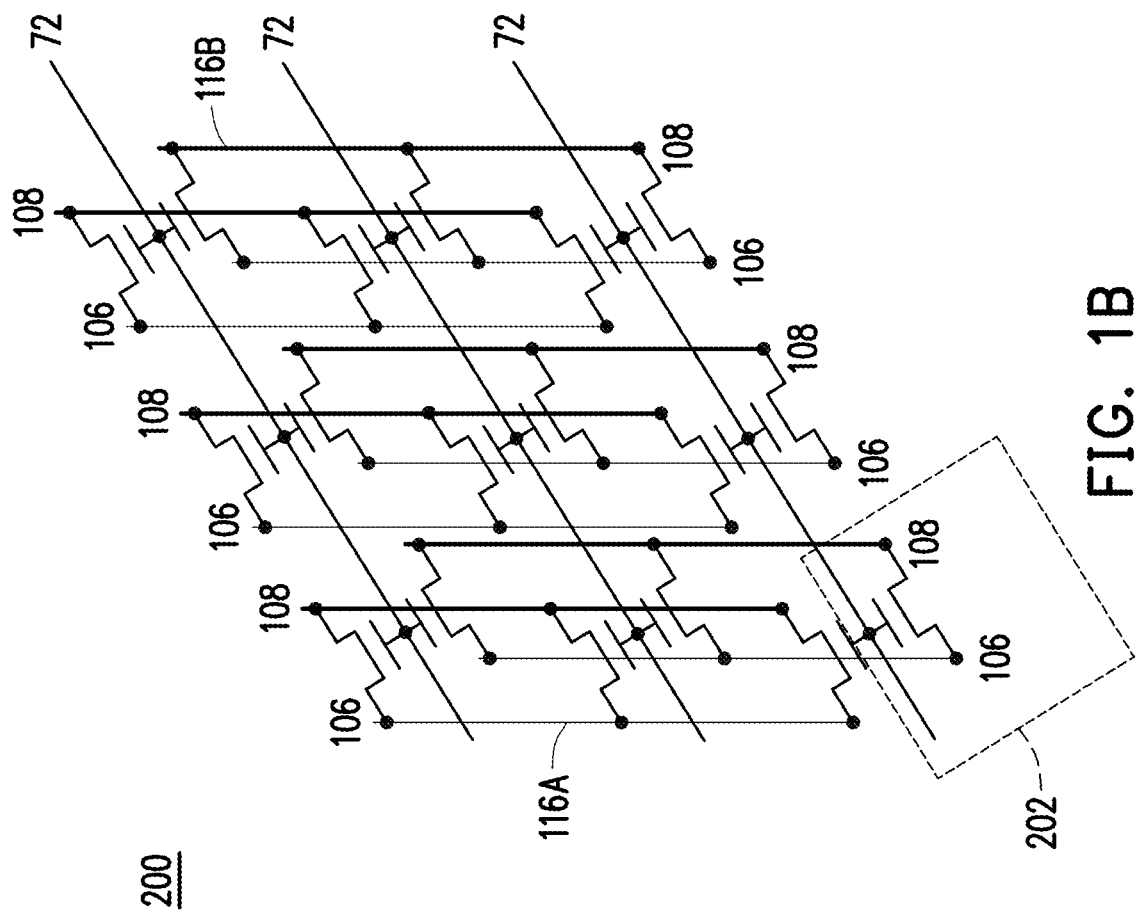

FIGS. 1A and 1B illustrate examples of a memory device according to some embodiments. FIG. 1A illustrates an example of a portion of a simplified memory device 200 in a partial three-dimensional view, and FIG. 1B illustrates a circuit diagram of the memory device 200 in accordance with some embodiments. The memory device 200 (also referred to as a memory array) includes a plurality of memory cells 202, which may be arranged in a grid of rows and columns. The memory cells 202 may be further stacked vertically to provide a three dimensional memory device, thereby increasing device density. The memory device 200 may be disposed in the back end of line (BEOL) of a semiconductor die. For example, the memory device is disposed in the interconnect layers of the semiconductor die, such as, above one or more active devices (e.g., transistors) formed on a semiconductor substrate.

In some embodiments, the memory device 200 is a flash memory device, such as a NOR flash memory device, or the like. In some embodiments, a gate of each memory cell 202 is electrically coupled to a respective word line (e.g., conductive line 72), a first source/drain region of each memory cell 202 is electrically coupled to a respective bit line (e.g., conductive line 116B as shown in FIG. 25C), and a second source/drain region of each memory cell 202 is electrically coupled to a respective source line (e.g., conductive line 116B as shown in FIG. 25C). The memory cells 202 in a same horizontal row of the memory device 200 may share a common word line while the memory cells 202 in a same vertical column of the memory device 200 may share a common source line and a common bit line.

The memory device 200 includes a plurality of vertically stacked conductive lines 72 (e.g., word lines) with dielectric layers 52 disposed between adjacent ones of the conductive lines 72. The conductive lines 72 extend in a direction parallel to a major surface of an underlying substrate (not explicitly illustrated in FIG. 1A), which may be a complementary metal oxide semiconductor (CMOS) under array (CUA) die. The conductive lines 72 may have a staircase configuration such that lower conductive lines 72 are longer than and extend laterally past endpoints of upper conductive lines 72. For example, in FIG. 1A, multiple, stacked layers of conductive lines 72 are illustrated with topmost conductive lines 72 being the shortest and bottommost conductive lines 72 being the longest. Respective lengths of the conductive lines 72 may increase in a direction towards the underlying substrate. In this manner, a portion of each of the conductive lines 72 may be accessible from above the memory device 200, and conductive contacts may be made to exposed portions of the conductive lines 72, respectively.

The memory device 200 further includes conductive pillars 106 (e.g., electrically connected to bit lines) and conductive pillars 108 (e.g., electrically connected to source lines) arranged alternately. The conductive pillars 106 and 108 may each extend in a direction perpendicular to the conductive lines 72. A dielectric material 98 is disposed between and isolates adjacent ones of the conductive pillars 106 and the conductive pillars 108.

Pairs of the conductive pillars 106 and 108 along with an intersecting conductive line 72 define boundaries of each memory cell 202, and an isolation structure 102 is disposed between and isolates adjacent pairs of the conductive pillars 106 and 108. In some embodiments, the conductive pillars 108 are electrically coupled to ground. Although FIG. 1A illustrates a particular placement of the conductive pillars 106 relative the conductive pillars 108, it should be appreciated that the placement of the conductive pillars 106 and 108 may be exchanged in other embodiments.

In some embodiments, the memory device 200 includes an oxide semiconductor (OS) material as a channel layer 92. The channel layer 92 may provide channel regions for the memory cells 202. For example, when an appropriate voltage (e.g., higher than a respective threshold voltage (Vth) of a corresponding memory cell 202) is applied through a corresponding conductive line 72, a region of the channel layer 92 that intersects the conductive line 72 allows current to flow between the conductive pillars 106 and the conductive pillars 108 (e.g., from the conductive pillars 108 to the conductive pillars 106).

In some embodiments, a memory material layer 90 is disposed between the channel layer 92 and each of the conductive lines 72 and the dielectric layers 52, and the memory material layer 90 serve as a gate dielectric for each memory cell 202. In some embodiments, the memory material layer 90 includes a ferroelectric material, such as a hafnium oxide, hafnium zirconium oxide, silicon-doped hafnium oxide, or the like.

The memory material layer 90 may be polarized in one of two different directions, and the polarization direction may be changed by applying an appropriate voltage differential across the memory material layer 90 and generating an appropriate electric field. The polarization may be relatively localized (e.g., generally contained within each boundaries of the memory cells 202), and a continuous region of the memory material layer 90 may extend across a plurality of memory cells 202. Depending on a polarization direction of a particular region of the memory material layer 90, a threshold voltage of a corresponding memory cell 202 varies, and a digital value (e.g., 0 or 1) can be stored. For example, when a region of the memory material layer 90 has a first electrical polarization direction, the corresponding memory cell 202 may have a relatively low threshold voltage, and when the region of the memory material layer 90 has a second electrical polarization direction, the corresponding memory cell 202 may have a relatively high threshold voltage. The difference between the two threshold voltages may be referred to as the threshold voltage shift. A larger threshold voltage shift makes it easier (e.g., less error prone) to read the digital value stored in the corresponding memory cell 202.

To perform a write operation on a memory cell 202 in such embodiments, a write voltage is applied across a portion of the memory material layer 90 corresponding to the memory cell 202. In some embodiments, the write voltage is applied, for example, by applying appropriate voltages to a corresponding conductive line 72 (e.g., the word line) and the corresponding conductive pillars 106/108 (e.g., the bit line/source line). By applying the write voltage across the portion of the memory material layer 90, a polarization direction of the region of the memory material layer 90 may be changed. As a result, the corresponding threshold voltage of the corresponding memory cell 202 may also be switched from a low threshold voltage to a high threshold voltage or vice versa, and a digital value may be stored in the memory cell 202. Because the conductive lines 72 intersect the conductive pillars 106 and 108, individual memory cells 202 may be selected for the write operation.

To perform a read operation on the memory cell 202 in such embodiments, a read voltage (a voltage between the low and high threshold voltages) is applied to the corresponding conductive line 72 (e.g., the world line). Depending on the polarization direction of the corresponding region of the memory material layer 90, the memory cell 202 may or may not be turned on. As a result, the conductive pillar 106 may or may not be discharged through the conductive pillar 108 (e.g., a source line that is coupled to ground), and the digital value stored in the memory cell 202 can be determined. Because the conductive lines 72 intersect the conductive pillars 106 and 108, individual memory cells 202 may be selected for the read operation.

FIG. 1A further illustrates reference cross-sections of the memory device 200 that are used in later figures. Cross-section B-B' is along a longitudinal axis of conductive lines 72 and in a direction, for example, parallel to the direction of current flow of the memory cells 202. Cross-section C-C' is perpendicular to cross-section B-B' and extends through the dielectric materials 98 and the dielectric materials 102. Cross-section D-D' is perpendicular to cross-section B-B' and extends through the dielectric materials 98 and the conductive pillars 106. Subsequent figures refer to these reference cross-sections for clarity.

Figure 2:
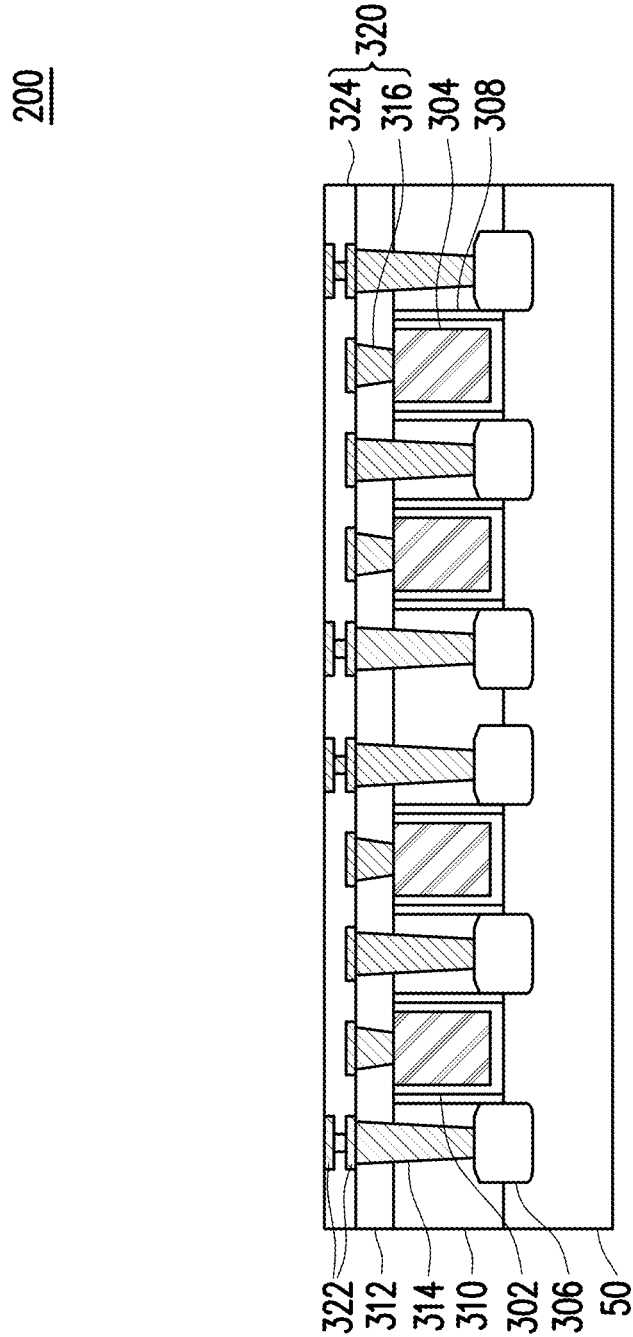
FIGS. 2, 3, 4, 5, 6, 7, 8, 9, 10, 11, 12, 13, 14, 15A, 15B, 16A, 16B, 17, 18, 19, 20A, 20B, 21A, 21B, 22A, 22B, 23A, 23B, 24A, 24B, 25A, 25B, 25C and 25D illustrate varying views of manufacturing a memory device in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be an integrated circuit die, such as a logic die, a memory die, an ASIC die, or the like. The substrate 50 may be a CUA die. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

FIG. 2 further illustrates circuits that may be formed over the substrate 50. The circuits include transistors at a top surface of the substrate 50. The transistors may include gate dielectric layers 302 over top surfaces of the substrate 50 and gate electrodes 304 over the gate dielectric layers 302. Source/drain regions 306 are disposed in the substrate 50 on opposite sides of the gate dielectric layers 302 and the gate electrodes 304. Gate spacers 308 are formed along sidewalls of the gate dielectric layers 302 and separate the source/drain regions 306 from the gate electrodes 304 by appropriate lateral distances. The transistors may include fin field effect transistors (FinFETs), nanostructure (e.g., nanosheet, nanowire, gate-all-around, or the like) FETS (nano-FETs), planar FETs, the like, or combinations thereof, and may be formed by gate-first processes or gate-last processes.

A first inter-layer dielectric (ILD) 310 surrounds and isolates the source/drain regions 306, the gate dielectric layers 302, and the gate electrodes 304 and a second ILD 312 is over the first ILD 310. Source/drain contacts 314 extend through the second ILD 312 and the first ILD 310 and are electrically coupled to the source/drain regions 306 and gate contacts 316 extend through the second ILD 312 and are electrically coupled to the gate electrodes 304. An interconnect structure 320 is over the second ILD 312, the source/drain contacts 314, and the gate contacts 316. The interconnect structure 320 includes one or more stacked dielectric layers 324 and conductive features 322 formed in the one or more dielectric layers 324, for example. The interconnect structure 320 may be electrically connected to the gate contacts 316 and the source/drain contacts 314 to form functional circuits. In some embodiments, the functional circuits formed by the interconnect structure 320 may include logic circuits, memory circuits, sense amplifiers, controllers, input/output circuits, image sensor circuits, the like, or combinations thereof. Although FIG. 2 discusses transistors formed over the substrate 50, other active devices (e.g., diodes or the like) and/or passive devices (e.g., capacitors, resistors, or the like) may also be formed as part of the functional circuits.

Figure 3:
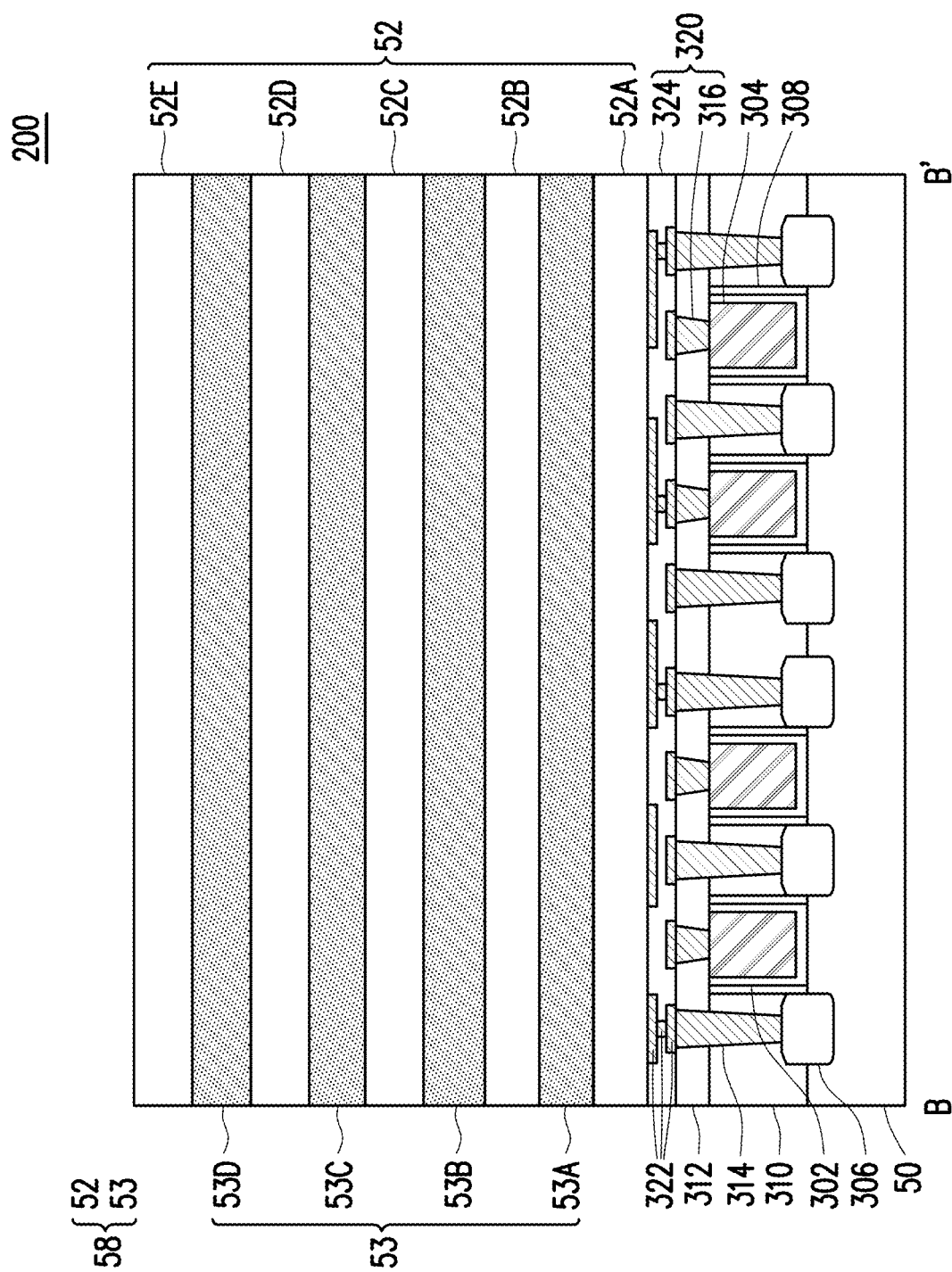

In FIG. 3, a multi-layer stack 58 is formed over the structure of FIG. 2. The substrate 50, the transistors, the ILDs 310 and 312, and the interconnect structure 320 may be omitted from subsequent drawings for the purposes of simplicity and clarity. Although the multi-layer stack 58 is illustrated as contacting the dielectric layers 324 of the interconnect structure 320, any number of intermediate layers may be disposed between the substrate 50 and the multi-layer stack 58. For example, one or more interconnect layers including conductive features in insulating layers (e.g., low-k dielectric layers) may be disposed between the substrate 50 and the multi-layer stack 58. In some embodiments, the conductive features may be patterned to provide power, ground, and/or signal lines for the active devices on the substrate 50 and/or the memory device 200 (see FIGS. 1A and 1B). In some embodiments, one or more interconnect layers including conductive features in insulating layers (e.g., low-k dielectric layers) are disposed over the multi-layer stack 58.

In FIG. 3, the multi-layer stack 58 includes alternating layers of sacrificial layers 53A-53D (collectively referred to as sacrificial layers 53) and dielectric layers 52A-52E (collectively referred to as dielectric layers 52). The sacrificial layers 53 may be patterned and replaced in subsequent steps to define conductive lines 72 (e.g., the word lines). The sacrificial layers 53 may include dielectric materials, such as silicon oxide, silicon nitride, silicon oxynitride, combinations thereof, or the like. The dielectric layers 52 may include insulating materials, such as silicon oxide, silicon nitride, silicon oxynitride, combinations thereof, or the like. The sacrificial layers 53 and the dielectric layers 52 include different materials with different etching selectivities. In some embodiments, the sacrificial layers 53 include silicon nitride, and the dielectric layers 52 include silicon oxide. Each of the sacrificial layers 53 and the dielectric layers 52 may be formed using, for example, chemical vapor deposition (CVD), atomic layer deposition (ALD), physical vapor deposition (PVD), plasma enhanced CVD (PECVD), or the like.

Although FIG. 3 illustrates a particular number of the sacrificial layers 53 and the dielectric layers 52, other embodiments may include different numbers of the sacrificial layers 53 and the dielectric layers 52. Besides, although the multi-layer stack 58 is illustrated as having dielectric layers as topmost and bottommost layers, the disclosure is not limited thereto. In some embodiments, at least one of the topmost and bottommost layers of the multi-layer stack 58 is a sacrificial layer.

FIGS. 4 through 12 are views of intermediate stages in the manufacturing a staircase structure of the memory device 200, in accordance with some embodiments. FIGS. 4 through 12 are illustrated along reference cross-section B-B' illustrated in FIG. 1A.

Figure 4:
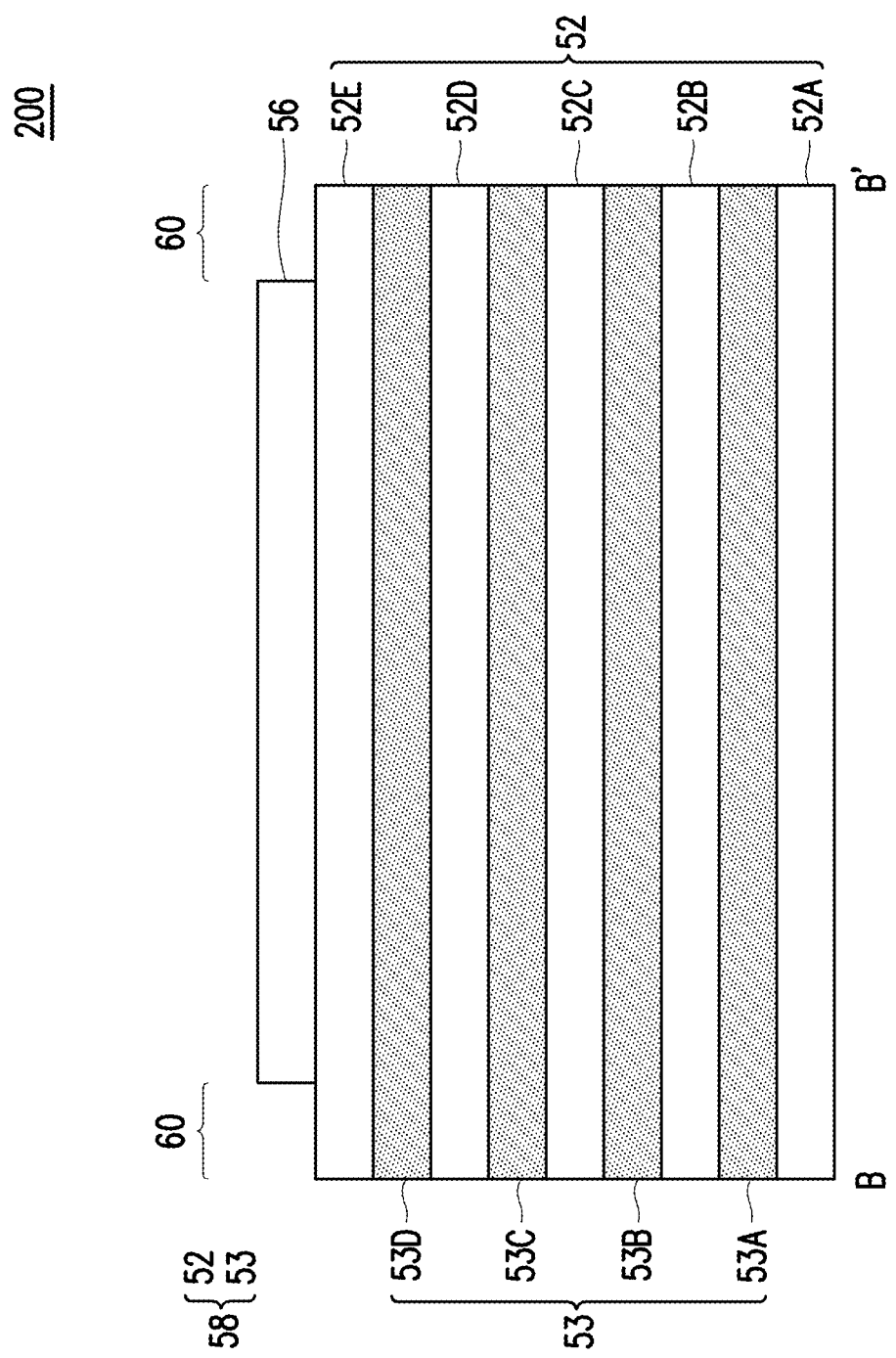

In FIG. 4, a photoresist 56 is formed over the multi-layer stack 58. In some embodiments, the photoresist 56 is formed by a spin-on technique and patterned by an acceptable photolithography technique. Patterning the photoresist 56 may expose the multi-layer stack 58 in regions 60, while masking remaining portions of the multi-layer stack 58. For example, a topmost layer of the multi-layer stack 58 (e.g., the dielectric layer 52E) is exposed in the regions 60.

Figure 5:
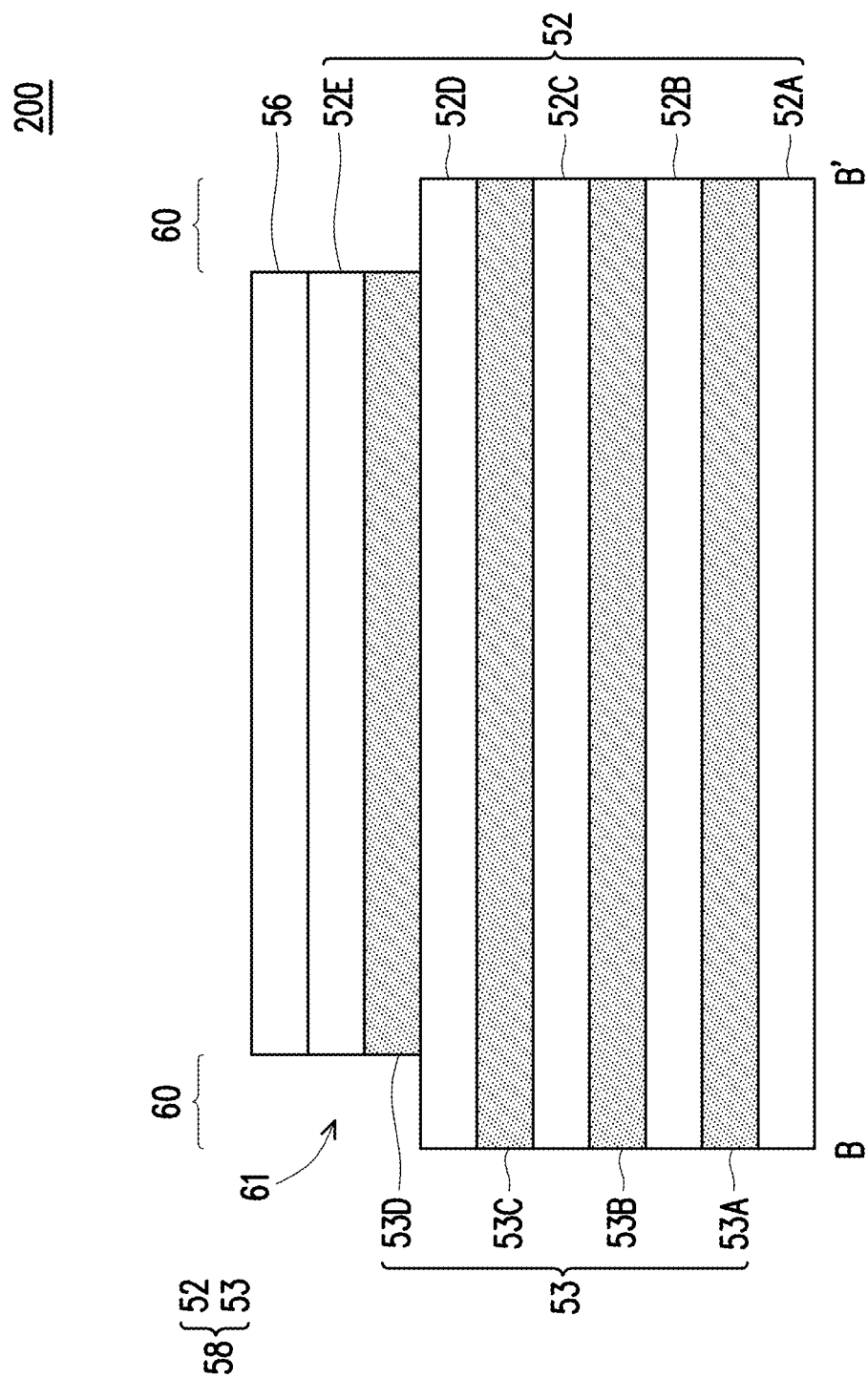

In FIG. 5, the exposed portions of the multi-layer stack 58 in the regions 60 are etched using the photoresist 56 as a mask. The etching may be any acceptable etching process, such as a dry etch (e.g., a reactive ion etch (RIE), a neutral beam etch (NBE), the like), a wet etch, the like, or a combination thereof. The etching may be anisotropic. The etching may remove portions of the dielectric layer 52E and the sacrificial layer 53D in the regions 60 and define openings 61. Because the dielectric layer 52E and the sacrificial layer 53D have different material compositions, etchants used to remove exposed portions of these layers may be different. In some embodiments, the sacrificial layer 53D acts as an etch stop layer while etching the dielectric layer 52E, and the dielectric layer 52D acts as an etch stop layer while etching sacrificial layer 53D. As a result, the portions of the dielectric layer 52E and the sacrificial layer 53D may be selectively removed without removing remaining layers of the multi-layer stack 58, and the openings 61 may be extended to a desired depth. Alternatively, a time-mode etching process may be used to stop the etching of the openings 61 after the openings 61 reach a desired depth. In the resulting structure, the dielectric layer 52D is exposed in the regions 60.

Figure 6:
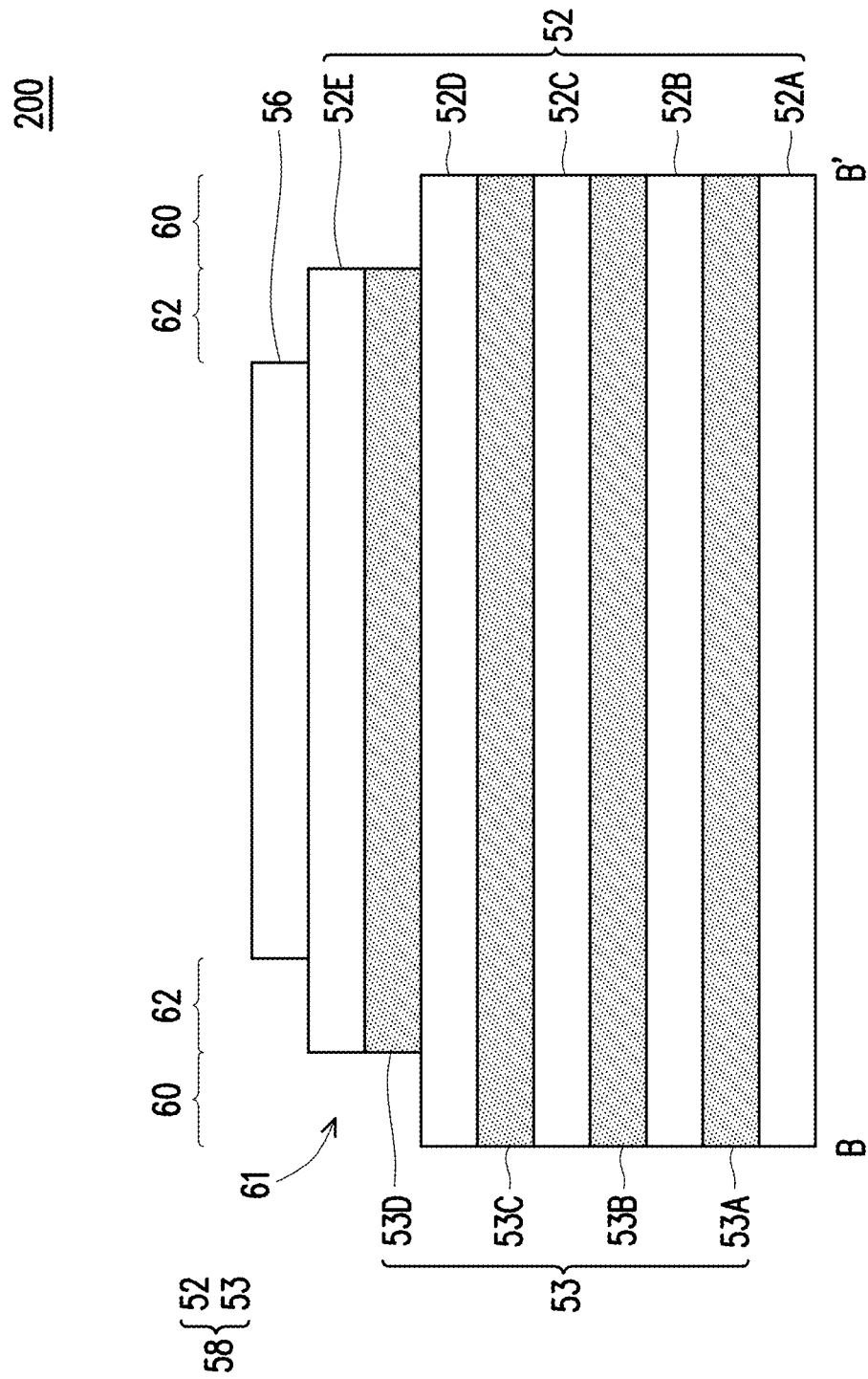

In FIG. 6, the photoresist 56 is trimmed to expose additional portions of the multi-layer stack 58. In some embodiments, the photoresist 56 is trimmed by using an acceptable removing technique such as a lateral etching. As a result of the trimming, a width of the photoresist 56 is reduced and portions the multi-layer stack 58 in the regions 60 and regions 62 may be exposed. For example, top surfaces of the dielectric layer 52D may be exposed in the regions 60, and top surfaces of the dielectric layer 52E may be exposed in the regions 62.

Figure 7:
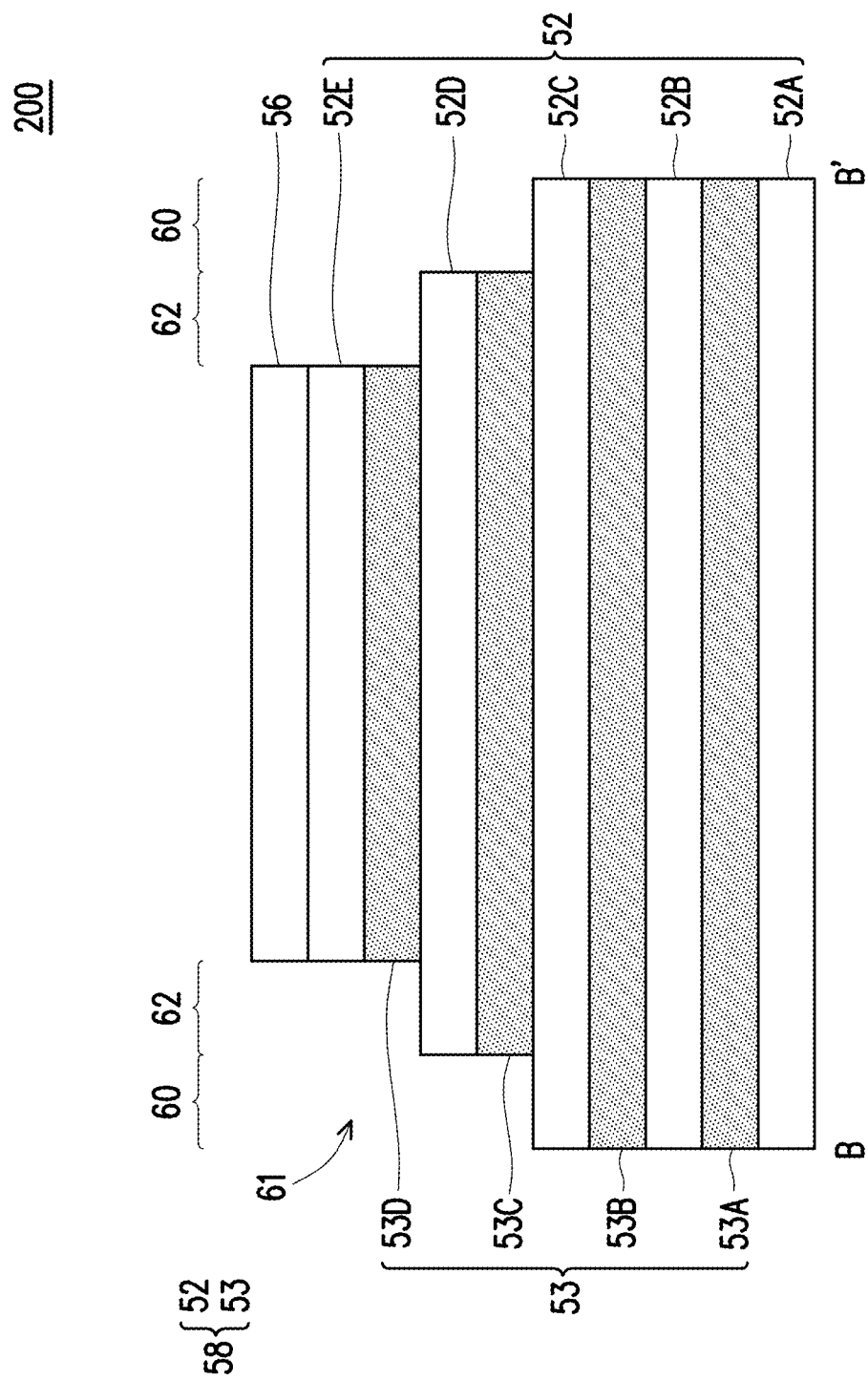

In FIG. 7, portions of the dielectric layer 52E, the sacrificial layer 53D, the dielectric layer 52D, and the sacrificial layer 53C in the regions 60 and the regions 62 are removed by acceptable etching processes using the photoresist 56 as a mask. The etching may be any acceptable etching process, such as a dry etch (e.g., RIE, NBE, the like), a wet etch, the like, or a combination thereof. The etching may be anisotropic. The etching may extend the openings 61 further into the multi-layer stack 58. Because the sacrificial layers 53D and 53C and the dielectric layers 52E and 52D have different material compositions, etchants used to remove exposed portions of these layers may be different. In some embodiments, portions of the dielectric layers 52E and 52D in the regions 62 and 60 are removed by using the photoresist 56 as a mask and using the underlying sacrificial layers 53D and 53C as etch stop layers. Thereafter, the exposed portions of the sacrificial layers 53D and 53C in the regions 62 and 60 are removed by using the photoresist 56 as a mask and using the underlying dielectric layers 52D and 52C as etching stop layers. In the resulting structure, the dielectric layer 52C is exposed in the regions 60, and the dielectric layer 52D is exposed in the regions 62.

Figure 8:
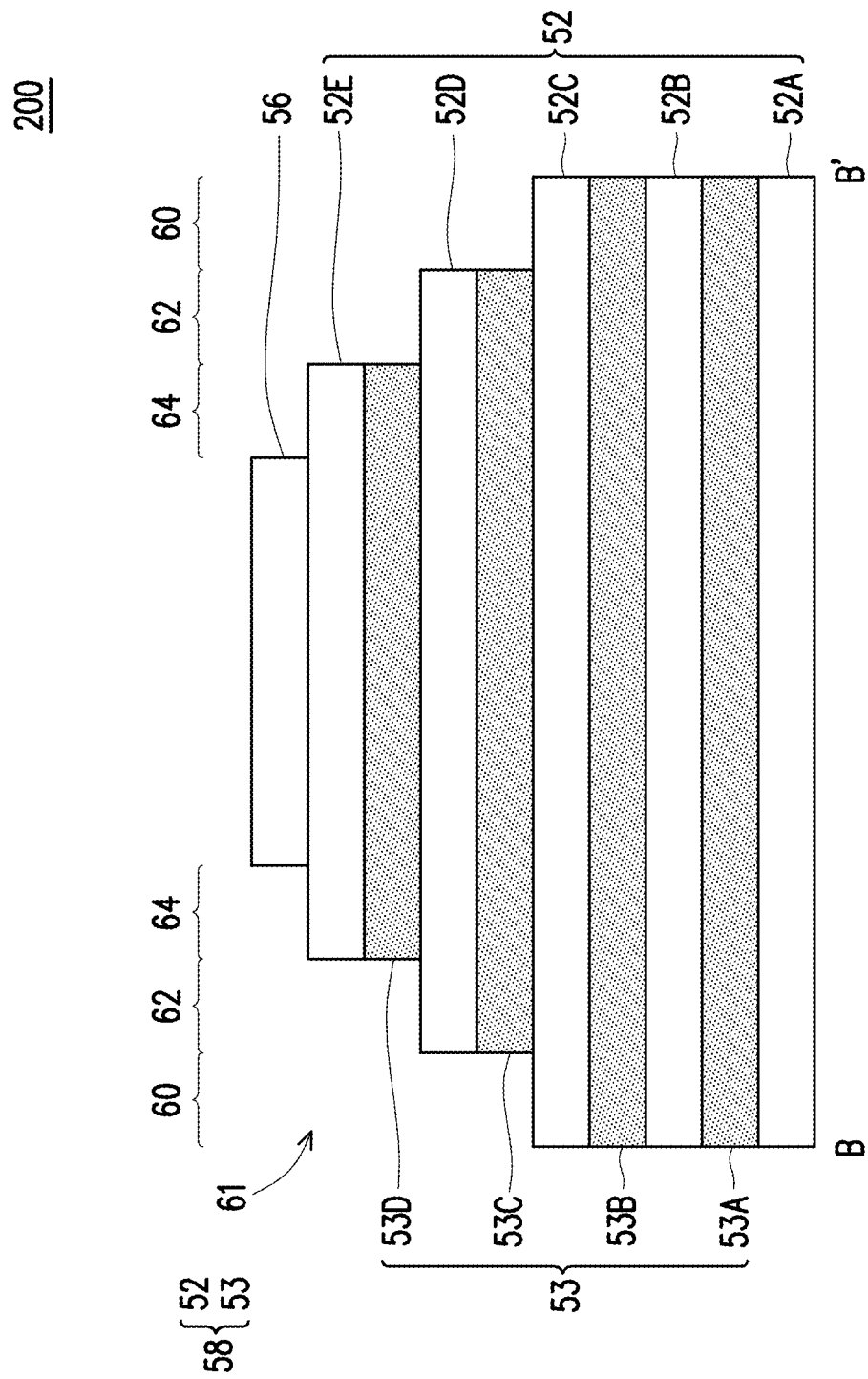

In FIG. 8, the photoresist 56 is trimmed to expose additional portions of the multi-layer stack 58. In some embodiments, the photoresist 56 is trimmed by using an acceptable removing technique such as a lateral etching. As a result of the trimming, a width of the photoresist 56 is reduced, and portions the multi-layer stack 58 in the regions 60, the regions 62, and regions 64 may be exposed. For example, top surfaces of the dielectric layer 52C are exposed in the regions 60; top surfaces of the dielectric layer 52D are exposed in the regions 62; and top surfaces of the dielectric layer 52E are exposed in the regions 64.

Figure 9:
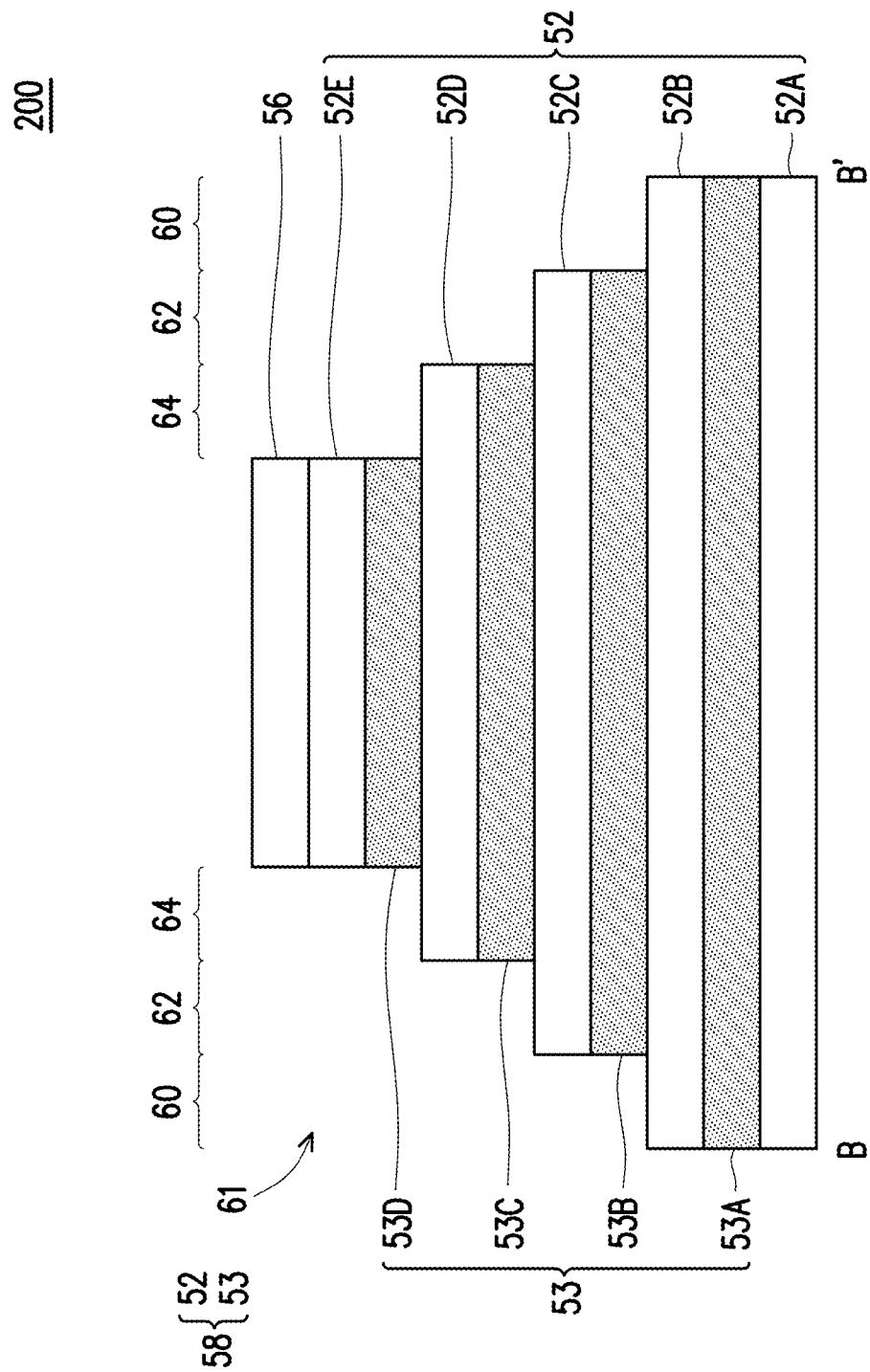

In FIG. 9, portions of the dielectric layers 52E, 52D, and 52C and the sacrificial layers 53D, 53C, and 53B in the regions 60, the regions 62, and the regions 64 are removed by acceptable etching processes using the photoresist 56 as a mask. The etching may be any acceptable etching process, such as a dry etch (e.g., RIE, NBE, the like), a wet etch, the like, or a combination thereof. The etching may be anisotropic. The etching may extend the openings 61 further into the multi-layer stack 58. Because the dielectric layers 52C-52E and the sacrificial layers 53B-53D have different material compositions, etchants used to remove exposed portions of these layers may be different. In some embodiments, portions of the dielectric layers 52E, 52D and 52C in the regions 64, 62 and 60 are removed by using the photoresist 56 as a mask and using the underlying sacrificial layers 53D, 53C and 53B as etch stop layers. Thereafter, the exposed portions of the sacrificial layers 53D, 53C and 53B in the regions 64, 62 and 60 are removed by using the photoresist 56 as a mask and using the underlying dielectric layers 52D, 52C and 52B as etching stop layers. In the resulting structure, the dielectric layer 52B is exposed in the regions 60; the dielectric layer 52C is exposed in the regions 62; and the dielectric layer 52D is exposed in the regions 64.

Figure 10:
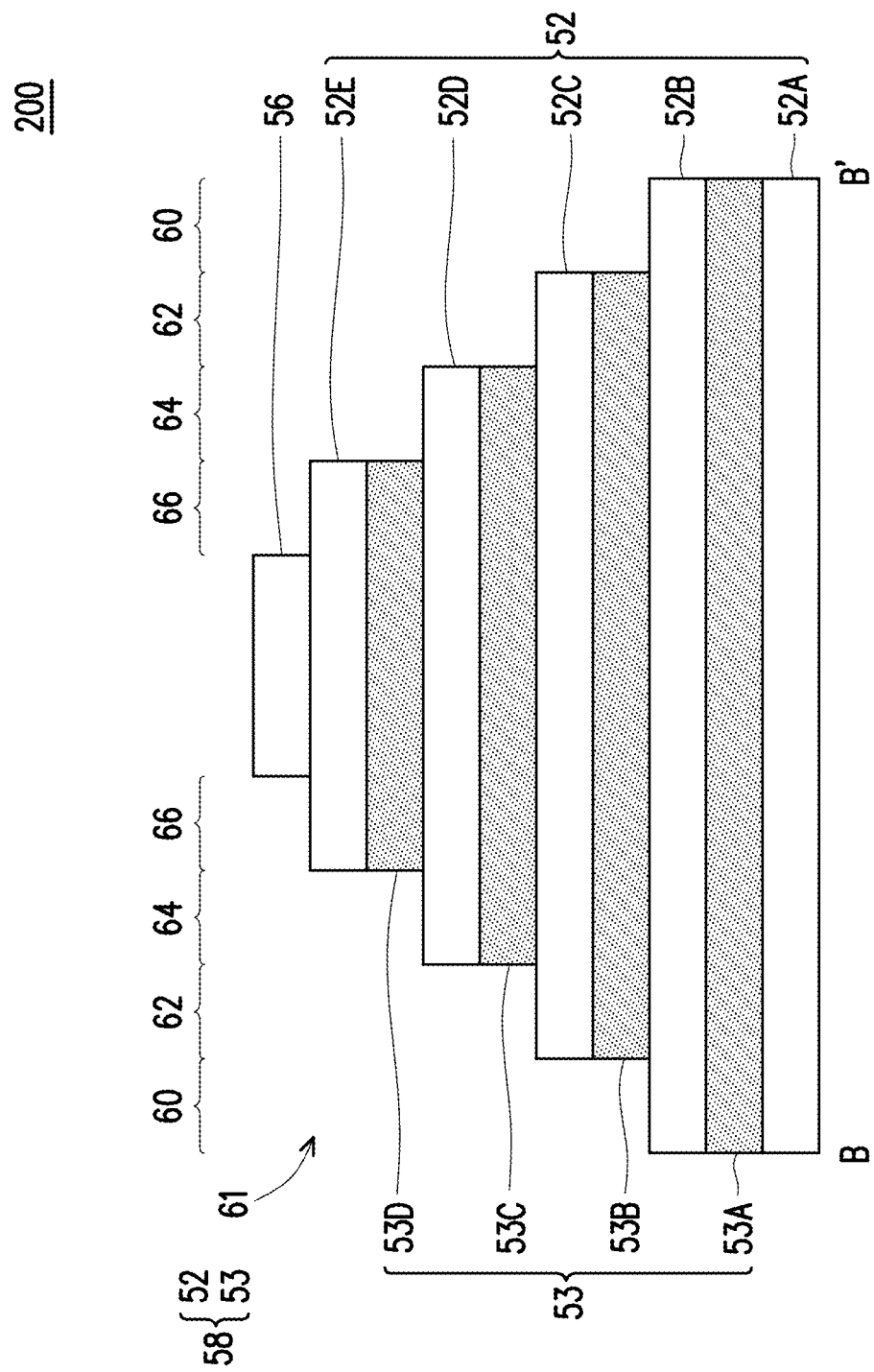

In FIG. 10, the photoresist 56 is trimmed to expose additional portions of the multi-layer stack 58. In some embodiments, the photoresist 56 is trimmed by using an acceptable removing technique such as a lateral etching. As a result of the trimming, a width of the photoresist 56 is reduced, and portions the multi-layer stack 58 in the regions 60, the regions 62, the regions 64, and regions 66 are exposed. For example, top surfaces of the dielectric layer 52B are exposed in the regions 60; top surfaces of the dielectric layer 52C are exposed in the regions 62; and top surfaces of the dielectric layer 52D are exposed in the regions 64; and top surfaces of the dielectric layer 52E are exposed in the regions 66.

Figure 11:
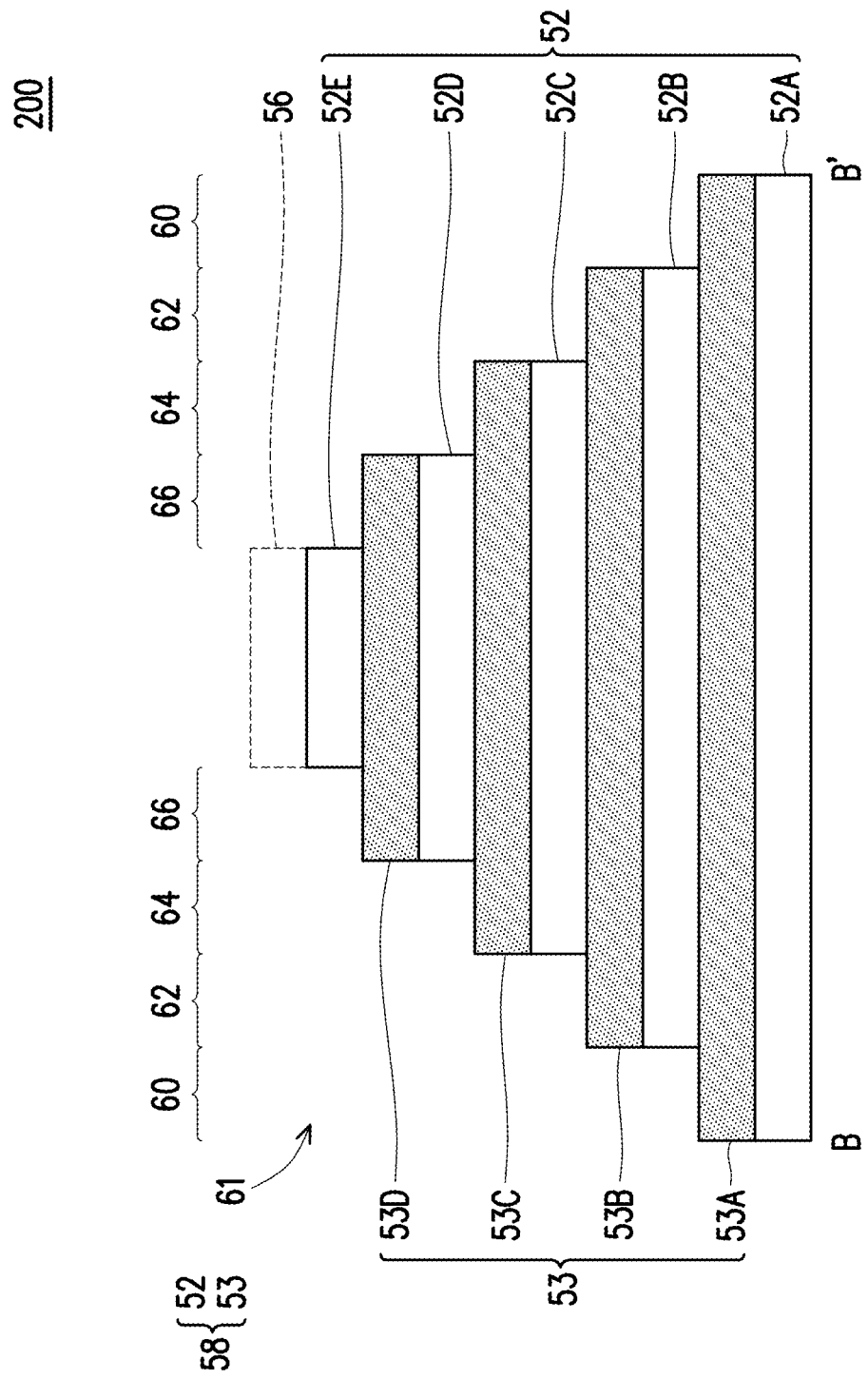

In FIG. 11, portions of the dielectric layers 52E, 52D, 52C, and 52B in the regions 60, the regions 62, the regions 64, and the regions 66 are removed by acceptable etching processes using the photoresist 56 as a mask. The etching may be any acceptable etching process, such as a dry etch (e.g., RIE, NBE, the like), a wet etch, the like, or a combination thereof. The etching may be anisotropic. The etching may extend the openings 61 further into the multi-layer stack 58. In some embodiments, portions of the dielectric layers 52E, 52D, 52C and 52B in the regions 66, 64, 62 and 60 are removed by using the photoresist 56 as a mask and using the underlying sacrificial layers 53D, 53C. 53B and 53A as etch stop layers. In the resulting structure, the sacrificial layer 53A is exposed in the regions 60; the sacrificial layer 53B is exposed in the regions 62; the sacrificial layer 53C is exposed in the regions 64; and the sacrificial layer 53D is exposed in the regions 66. Thereafter, the photoresist 56 may be removed by an acceptable ashing or wet strip process.

Figure 12:
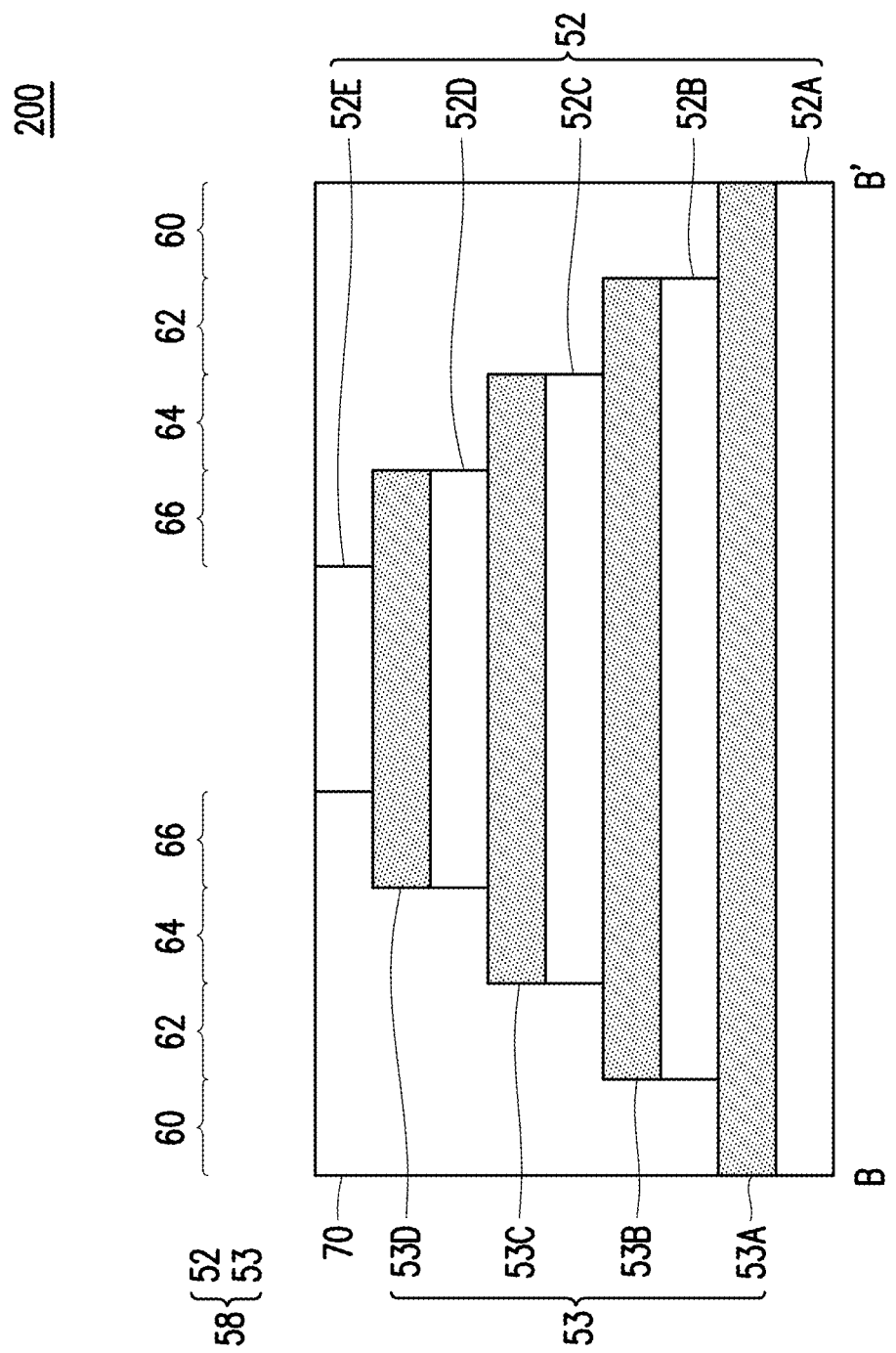

In FIG. 12, an inter-metal dielectric (IMD) 70 is formed over the multi-layer stack 58. The IMD 70 may be formed of a dielectric material, and may be deposited by any suitable method, such as CVD, PECVD, flowable CVD (FCVD), or the like. The dielectric materials may include phospho-silicate glass (PSG), boro-silicate glass (BSG), boron-doped phospho-silicate glass (BPSG), undoped silicate glass (USG), or the like. In some embodiments, the IMD 70 includes an oxide (e.g., silicon oxide or the like), a nitride (e.g., silicon nitride or the like), a combination thereof or the like. Other dielectric materials formed by any acceptable process may be used. Thereafter, a removal process is performed to remove excess dielectric material over the multi-layer stack 58. In some embodiments, the removal process is a planarization process, such as a chemical mechanical polish (CMP), an etch-back process, combinations thereof, or the like. The planarization process exposes the multi-layer stack 58 such that top surfaces of the multi-layer stack 58 and IMD 70 are level after the planarization process is completed. The IMD 70 extends along sidewalls of the sacrificial layers 53B-53D and sidewalls of the dielectric layers 52B-52E. Further, the IMD 70 may contact top surfaces of the sacrificial layers 53A-53D and the dielectric layer 52E.

Figure 16A:
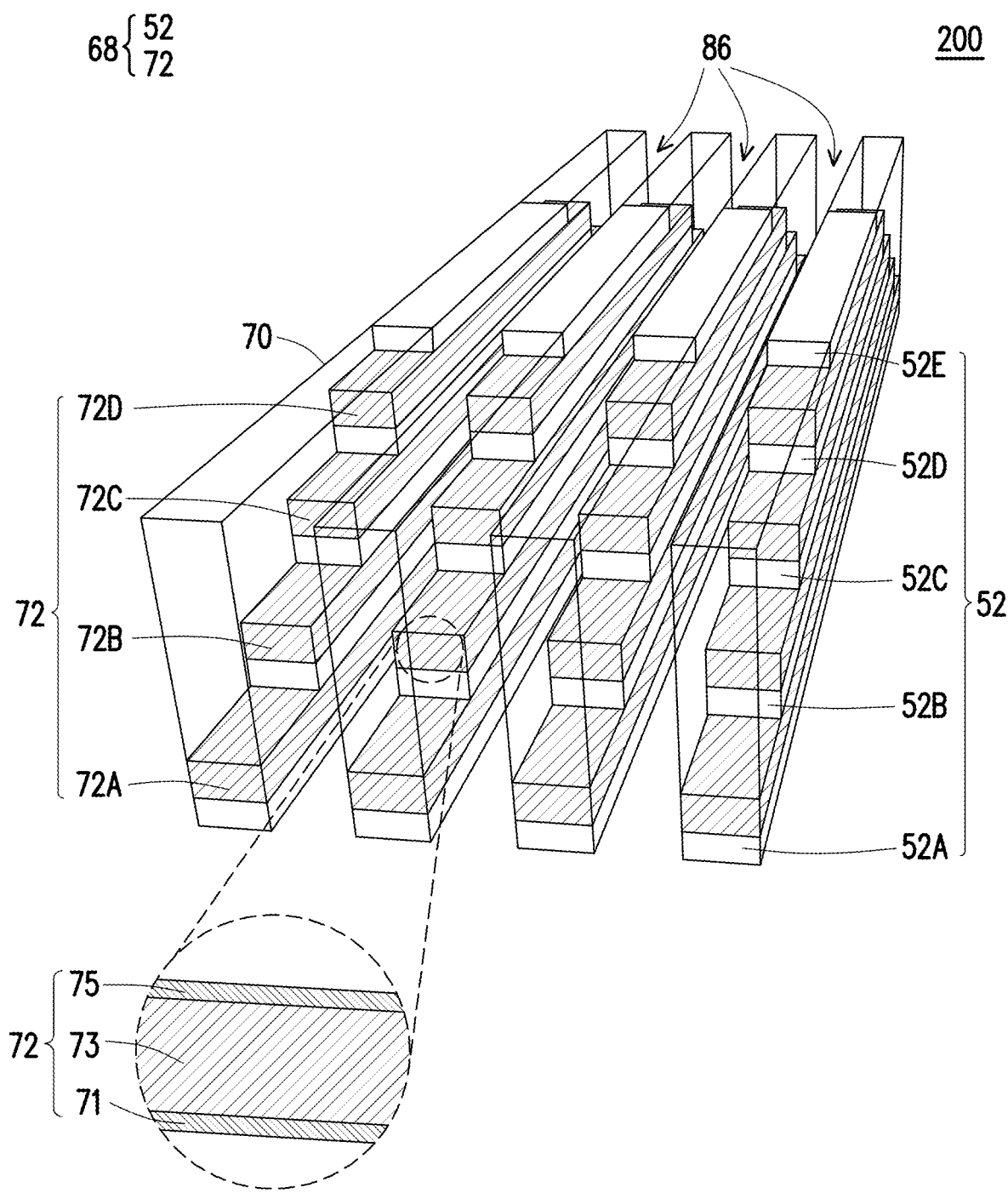
Figure 16B:
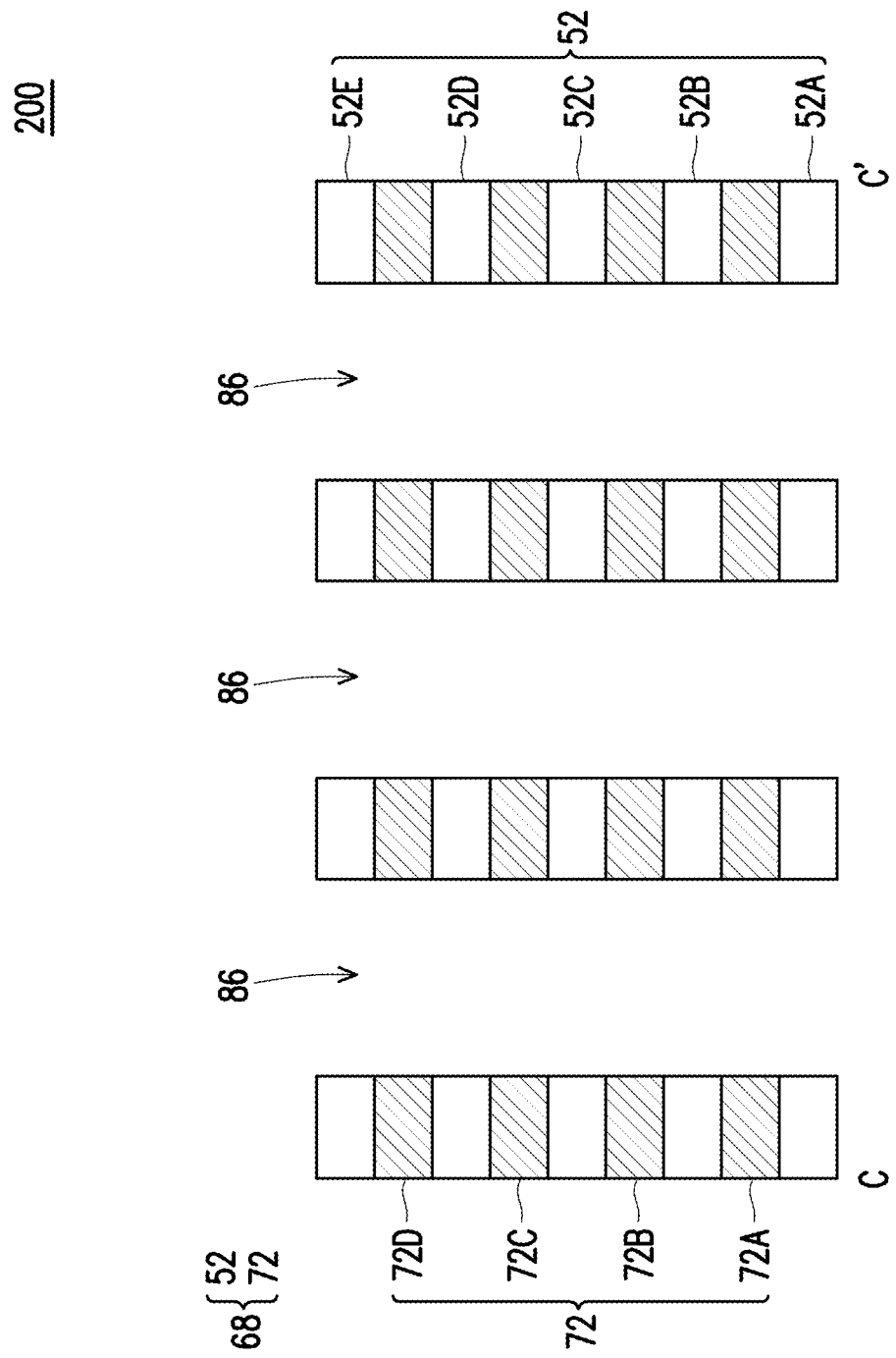

As shown in FIG. 12, an intermediate and bulk staircase structure is thus formed. The intermediate staircase structure includes alternating layers of sacrificial layers 53 and dielectric layers 52. The sacrificial layers 53 are subsequently replaced with conductive lines 72, which will be described in details in FIGS. 16A and 16B. Lower conductive lines 72 are longer and extend laterally past upper conductive lines 72, and a width of each of the conductive lines 72 increases in a direction towards the substrate 50 (see FIG. 1A).

FIGS. 13 through 16B are views of intermediate stages in the manufacturing of a memory region of the memory device 200, in accordance with some embodiments. In FIGS. 13 through 16B, the bulk multi-layer stack 58 is patterned to form trenches 86 therethrough, and sacrificial layers 53 are replaced with conductive materials to define the conductive lines 72. The conductive lines 72 may correspond to word lines in the memory device 200, and the conductive lines 72 may further provide gate electrodes for the resulting memory cells of the memory device 200. FIGS. 13, 14, 15B and 16B are illustrated along reference cross-section C-C' illustrated in FIG. 1A. FIGS. 15A and 16A are illustrated in a partial three-dimensional view.

Figure 13:
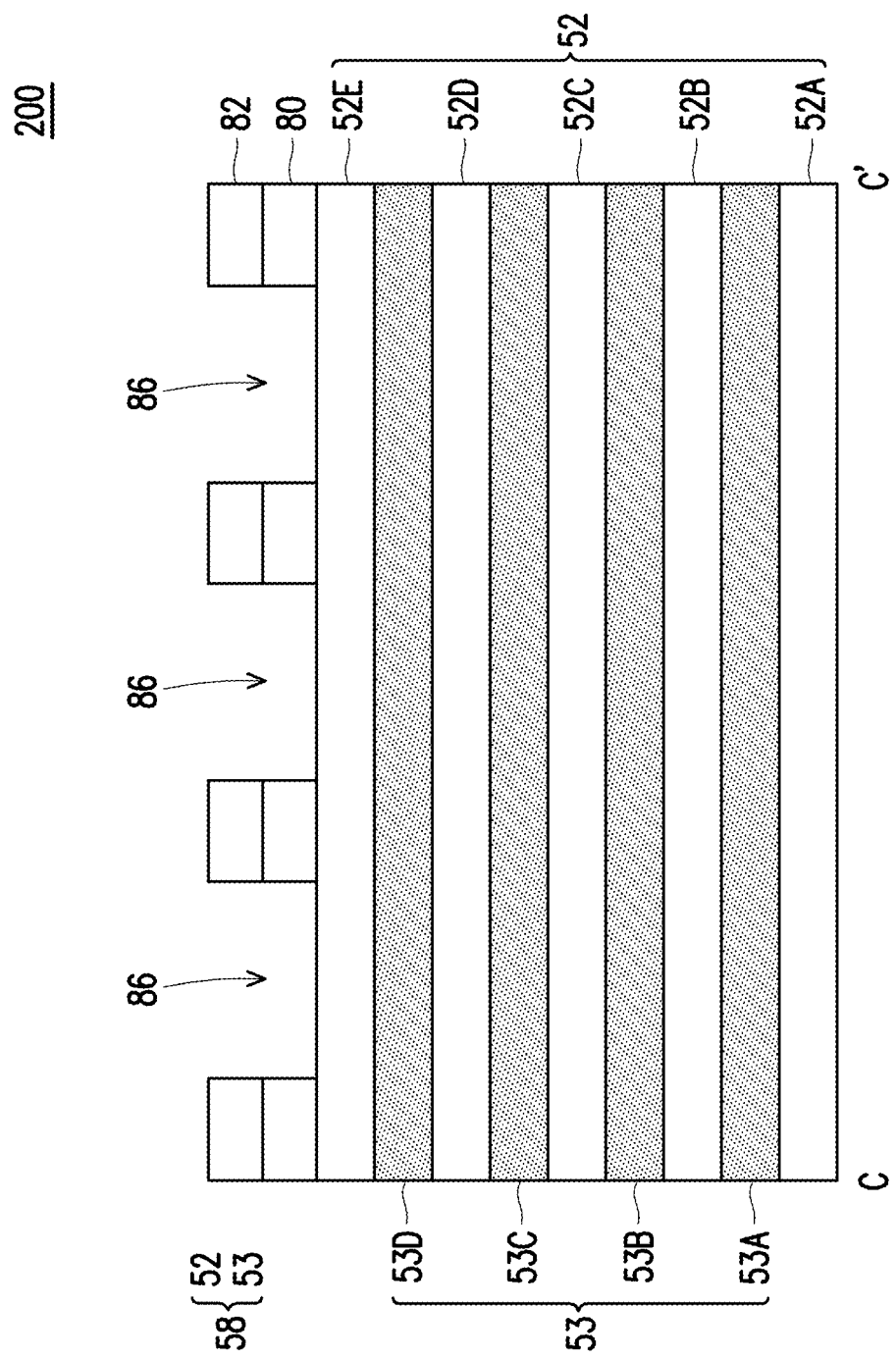

In FIG. 13, photoresist patterns 82 and underlying hard mask patterns 80 are formed over the multi-layer stack 58. In some embodiments, a hard mask layer and a photoresist layer are sequentially formed over the multi-layer stack 58. The hard mask layer may include, for example, silicon nitride, silicon oxynitride, or the like, which may be deposited by CVD, PVD, ALD, PECVD, or the like. The photoresist layer is formed by a spin-on technique, for example.

Thereafter, the photoresist layer is patterned to form photoresist patterns 82 and trenches 86 between the photoresist patterns 82. The photoresists is patterned by an acceptable photolithography technique, for example. The patterns of the photoresist patterns 82 are then transferred to the hard mask layer to form hard mask patterns 80 by using an acceptable etching process, such as by a dry etch (e.g., RIE, NBE, the like), a wet etch, the like, or a combination thereof. The etching may be anisotropic. Thus, trenches 86 are formed extending through the hard mask layer. Thereafter, the photoresist 82 may be optionally removed by an ashing process, for example.

Figure 14:
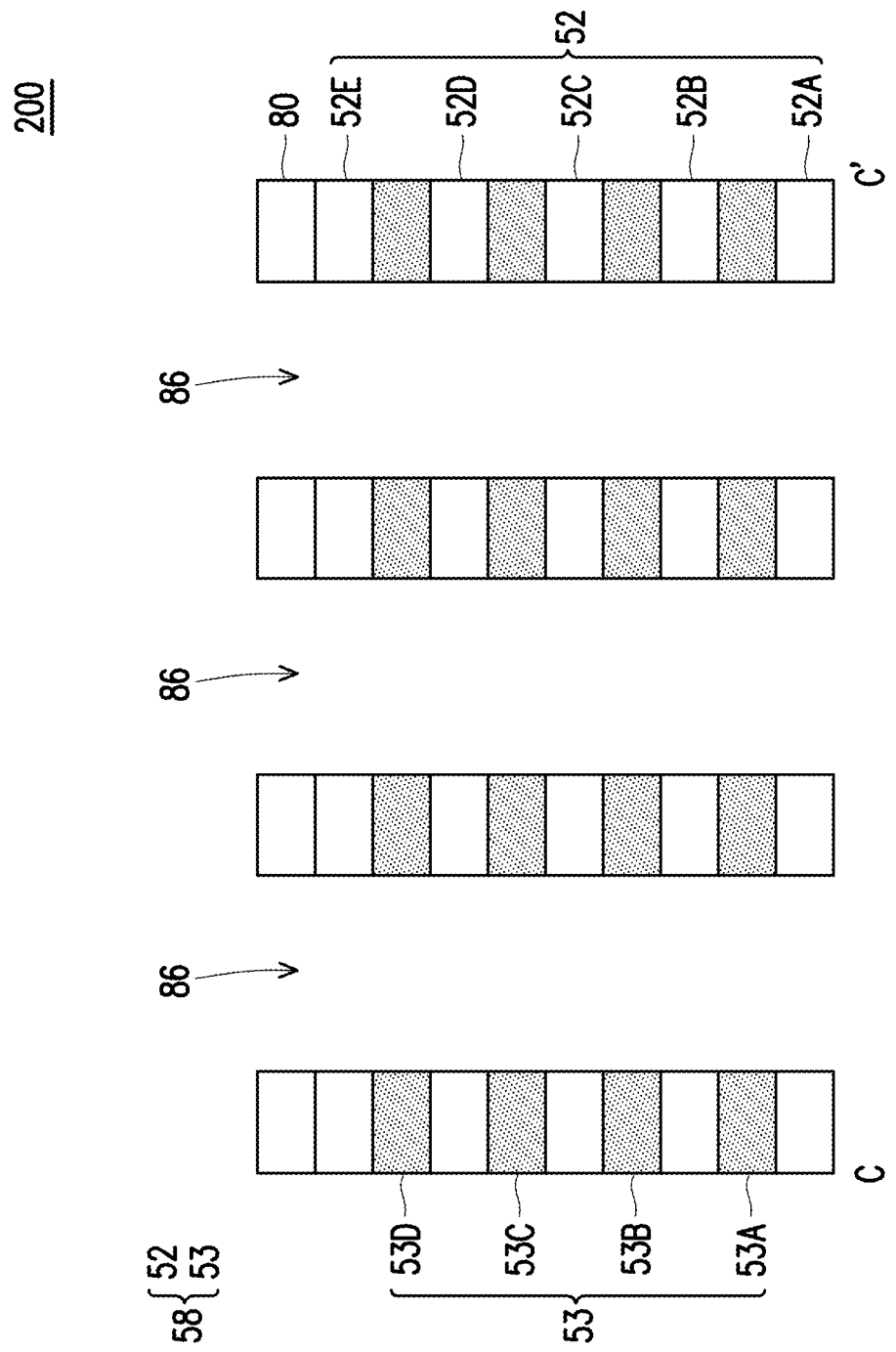
Figure 15A:
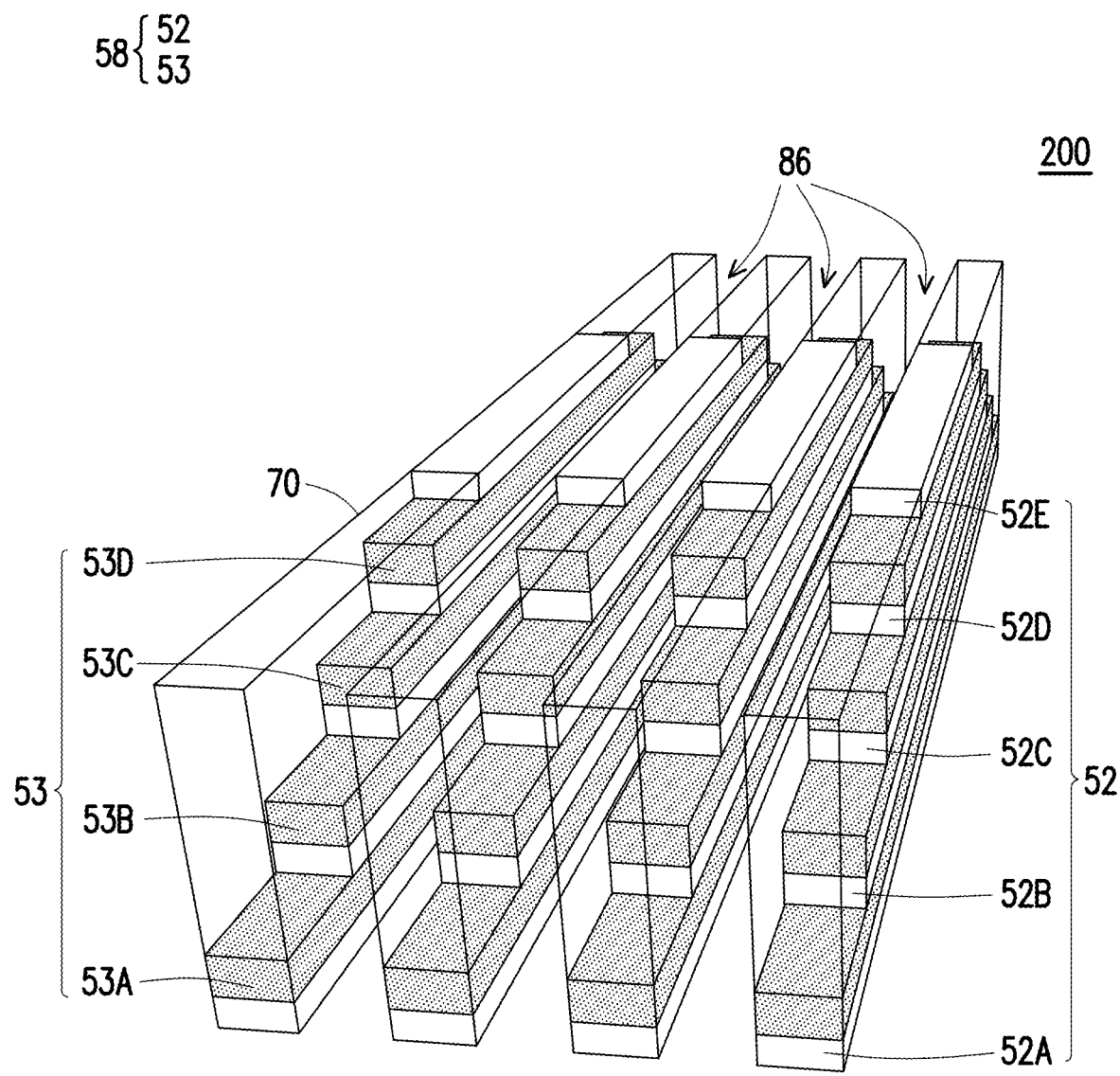
Figure 15B:
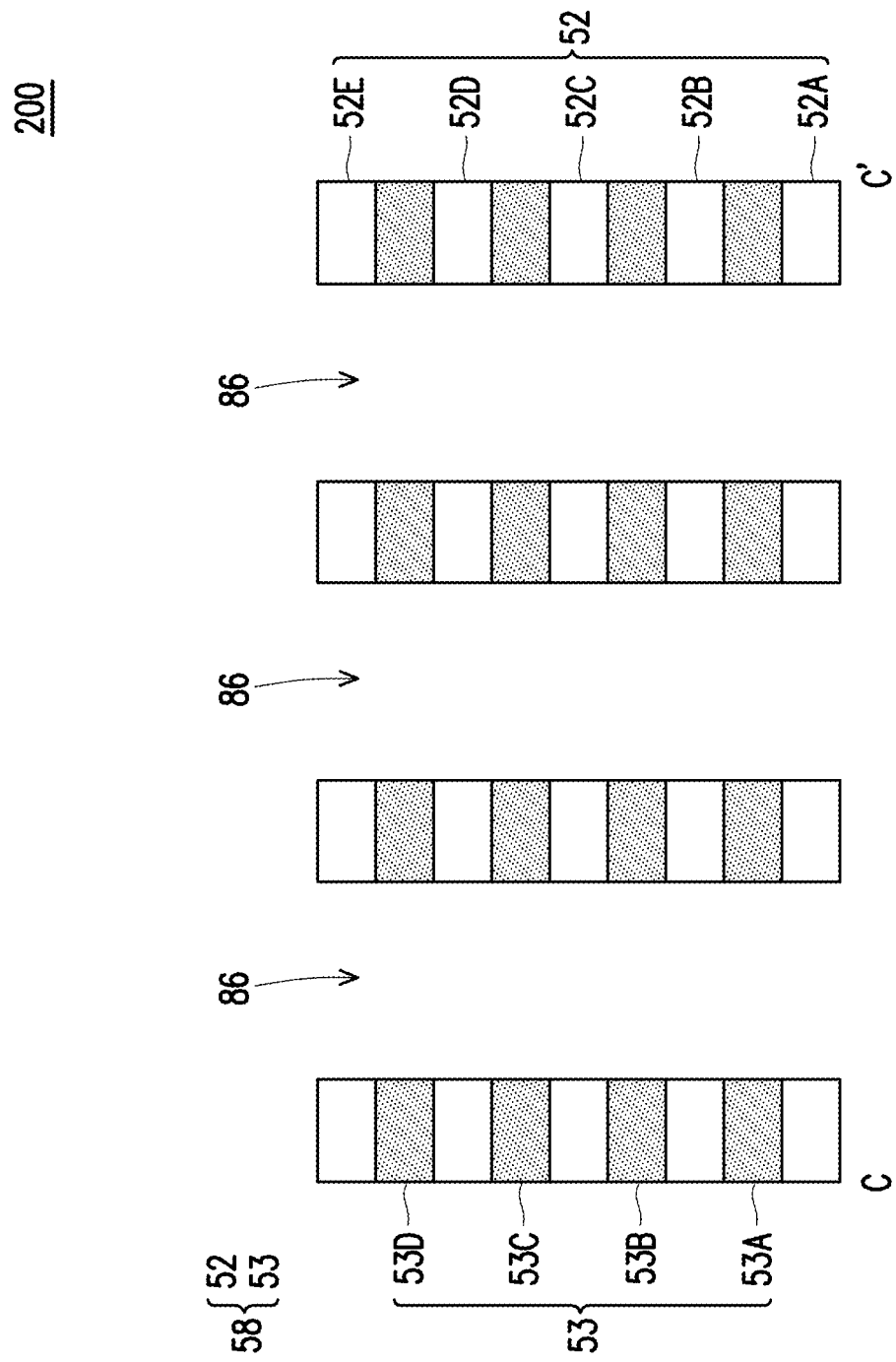

In FIGS. 14 to 15B, the patterns of the hard mask patterns 80 are transferred to the multi-layer stack 58 using one or more acceptable etching processes, such as by a dry etch (e.g., RIE, NBE, the like), a wet etch, the like, or a combination thereof. The etching processes may be anisotropic. Thus, the trenches 86 extend through the bulk multi-layer stack 58, and strip-shaped sacrificial layers 53 and strip-shaped dielectric layers 52 are accordingly defined. In some embodiments, the trenches 86 extend through the bulk staircase structure, and strip-shaped staircase structures are accordingly defined. The hard mask patterns 80 may be then removed by an acceptable process, such as a wet etching process, a dry etching process, a planarization process, combinations thereof, or the like.

In FIGS. 15A to 16B, the sacrificial layers 53A-53D (collectively referred to as sacrificial layers 53) are replaced with conductive lines 72A-72D (collectively referred to as conductive lines 72). In some embodiments, the sacrificial layers 53 are removed by an acceptable process, such as a wet etching process, a dry etching process or both. Thereafter, conductive lines 72 are filled into the spacing between two adjacent dielectric layers 52. As shown in the local enlarged view, each conductive line 72 includes two barrier layers 71 and 75 and a metal layer 73 between the barrier layers 71 and 75. Specifically, a barrier layer is disposed between the metal layer 73 and the adjacent dielectric layer 52. The barrier layers may prevent the metal layer from diffusion to the adjacent dielectric layers 52. The barrier layers may also provide the function of increasing the adhesion between the metal layer and the adjacent dielectric layers, and may be referred to as glue layers in some examples. In some embodiments, both barrier layers and glue layers with different materials are provided as needed. The barrier layers 71 and 75 are formed of a first conductive material, such as a metal nitride, such as titanium nitride, tantalum nitride, molybdenum nitride, zirconium nitride, hafnium nitride, or the like. The metal layer 73 may are formed of a second conductive material, such as a metal, such as tungsten, ruthenium, molybdenum, cobalt, aluminum, nickel, copper, silver, gold, alloys thereof, or the like. The barrier layers 71, 75 and metal layer 73 may each be formed by an acceptable deposition process such as CVD, PVD, ALD, PECVD, or the like. The barrier layers 71, 75 and the metal layer 73 are further deposited on the sidewalls of the multi-layer stack 58 and fill in the trenches 86.

Thereafter, the barrier layers 71, 75 and the metal layer 73 in the trenches 86 are removed by an etching back process. An acceptable etch back process may be performed to remove excess materials from the sidewalls of the dielectric layers 52 and the bottom surfaces of the trenches 86. The acceptable etch back process includes a dry etch (e.g., RIE, NBE, the like), a wet etch, the like, or a combination thereof. The acceptable etch back process may be anisotropic.

In some embodiments, upon the replacement process, the sacrificial layers 53 of the strip-shaped staircase structures are subsequently replaced with conductive lines 72 (see FIG. 1A), so as to form a plurality of strip-shaped staircase structures 68. In some embodiments, the strip-shaped staircase structure 68 includes alternating layers of conductive lines 72A-72D (collectively referred to as conductive lines 72) and dielectric layers 52A-52E (collectively referred to as dielectric layers 52).

FIGS. 17 through 22B illustrate forming and patterning channel regions for the memory cells 202 (see FIG. 1A) in the trenches 86. FIGS. 20A, 21A and 22A are illustrated in a partial three-dimensional view. In FIGS. 17, 18, 19, 20B, 21B and 22B cross-sectional views are provided along line C-C' of FIG. 1A.

Figure 17:
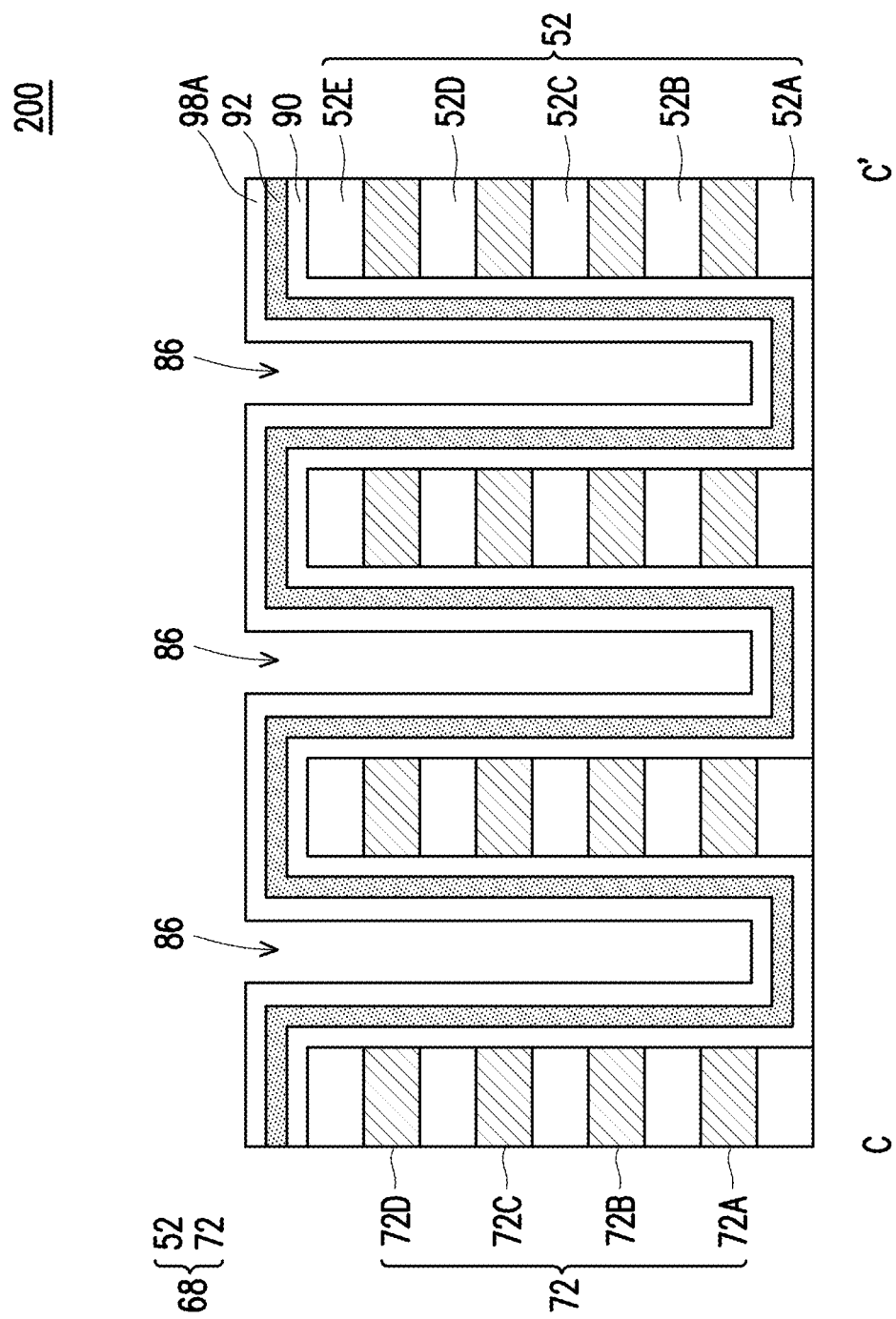

In FIG. 17, a memory material layer 90, a channel layer 92, and a dielectric material 98A are deposited in the trenches 86. In some embodiments, the memory material layer 90 is deposited conformally in the trenches 86 along sidewalls of the conductive lines 72 and along top surfaces of the dielectric layer 52E, and along the bottom surfaces of the trenches 86. In some embodiments, a memory material layer 90 may be further deposited on the IMD 70 and along the sidewall of each step of the staircase structure in the staircase region. The memory material layer 90 may include materials that are capable of switching between two different polarization directions by applying an appropriate voltage differential across the memory material layer 90. For example, the memory material layer 90 includes a high-k dielectric material, such as a hafnium (Hf) based dielectric materials or the like. In some embodiments, the memory material layer 90 includes hafnium oxide, hafnium zirconium oxide, silicon-doped hafnium oxide, or the like.

The memory material layer 90 may include barium titanium oxide ($BaTiO_3$), lead titanium oxide ($PbTiO_3$), lead zirconium oxide ($PbZrO_3$), lithium niobium oxide ($LiNbO_3$), sodium niobium oxide ($NaNbO_3$), potassium niobium oxide ($KNbO_3$), potassium tantalum oxide ($KTaO_3$), bismuth scandium oxide ($BiScO_3$), bismuth iron oxide ($BiFeO_3$), hafnium erbium oxide ($Hf_{1-x}Er_xO$), hafnium lanthanum oxide ($Hf_{1-x}La_xO$), hafnium yttrium oxide ($Hf_{1-x}Y_xO$), hafnium gadolinium oxide ($Hf_{1-x}Gd_xO$), hafnium aluminum oxide ($Hf_{1-x}Al_xO$), hafnium zirconium oxide ($Hf_{1-x}Zr_xO$, HZO), hafnium titanium oxide ($Hf_{1-x}Ti_xO$), hafnium tantalum oxide ($Hf_{1-x}Ta_xO$), or the like. In some embodiments, the memory material layer 90 may include different ferroelectric materials or different types of memory materials. For example, in some embodiments, the memory material layer 90 may be replaced with a non-ferroelectric material, such as a multilayer memory structure including a layer of $SiN_x$ between two $SiO_x$ layers (e.g., an ONO structure). In some embodiments, the method of forming the memory material layer 90 includes performing a suitable deposition technique, such as CVD, PECVD, metal oxide chemical vapor deposition (MOCVD), ALD, RPALD, PEALD, MBD or the like.

In some embodiments, the memory material layer 90 has a thickness of about 1-20 nm, such as 5-10 nm. Other thickness ranges (e.g., more than 20 nm or 5-15 nm) may be applicable. the memory material layer 90 is formed in a fully amorphous state. In alternative embodiments, the memory material layer 90 is formed in a partially crystalline state; that is, the memory material layer 90 is formed in a mixed crystalline-amorphous state and having some degree of structural order. In yet alternative embodiments, the memory material layer 90 is formed in a fully crystalline state. In some embodiments, the memory material layer 90 is a single layer. In alternative embodiments, the memory material layer 90 is a multi-layer structure.

After the memory material layer 90 is deposited, an annealing step may be performed, so as to achieve a desired crystalline lattice structure for the memory material layer 90. In some embodiments, upon the annealing process, the memory material layer 90 is transformed from an amorphous state to a partially or fully crystalline state. In alternative embodiments, upon the annealing memory material layer 90 is transformed from a partially crystalline state to a fully crystalline state.

Then, the channel layer 92 is conformally deposited in the trenches 86 over the memory material layer 90. The channel layer 92 includes materials suitable for providing channel regions for the memory cells 202 (see FIG. 1A). For example, the channel layer 92 includes oxide semiconductor (OS) such as zinc oxide (ZnO), indium tungsten oxide (InWO), indium gallium zinc oxide (InGaZnO, IGZO), indium zinc oxide (InZnO), indium tin oxide (ITO), combinations thereof, or the like. In some embodiments, the channel layer 92 includes polycrystalline silicon (poly-Si), amorphous silicon (a-Si), or the like. The channel layer 92 may be deposited by CVD, PVD, ALD, PECVD, or the like. The channel layer 92 may extend along the sidewalls and the bottom surfaces of the trenches 86 over the memory material layer 90. After the channel layer 92 is deposited, an annealing step may be performed to activate the charge carriers of the channel layer 92.

In some embodiments, the dielectric material 98A is deposited in the trenches 86 over the channel layer 92. In some embodiments, the dielectric material 98A includes silicon oxide, silicon nitride, silicon oxynitride, or the like, which may be deposited by CVD, PVD, ALD, PECVD, or the like. The dielectric material 98A may extend along sidewalls and bottom surfaces of the trenches 86 over the channel layer 92. In some embodiments, the dielectric material 98A is optional and may be omitted as needed.

Figure 18:
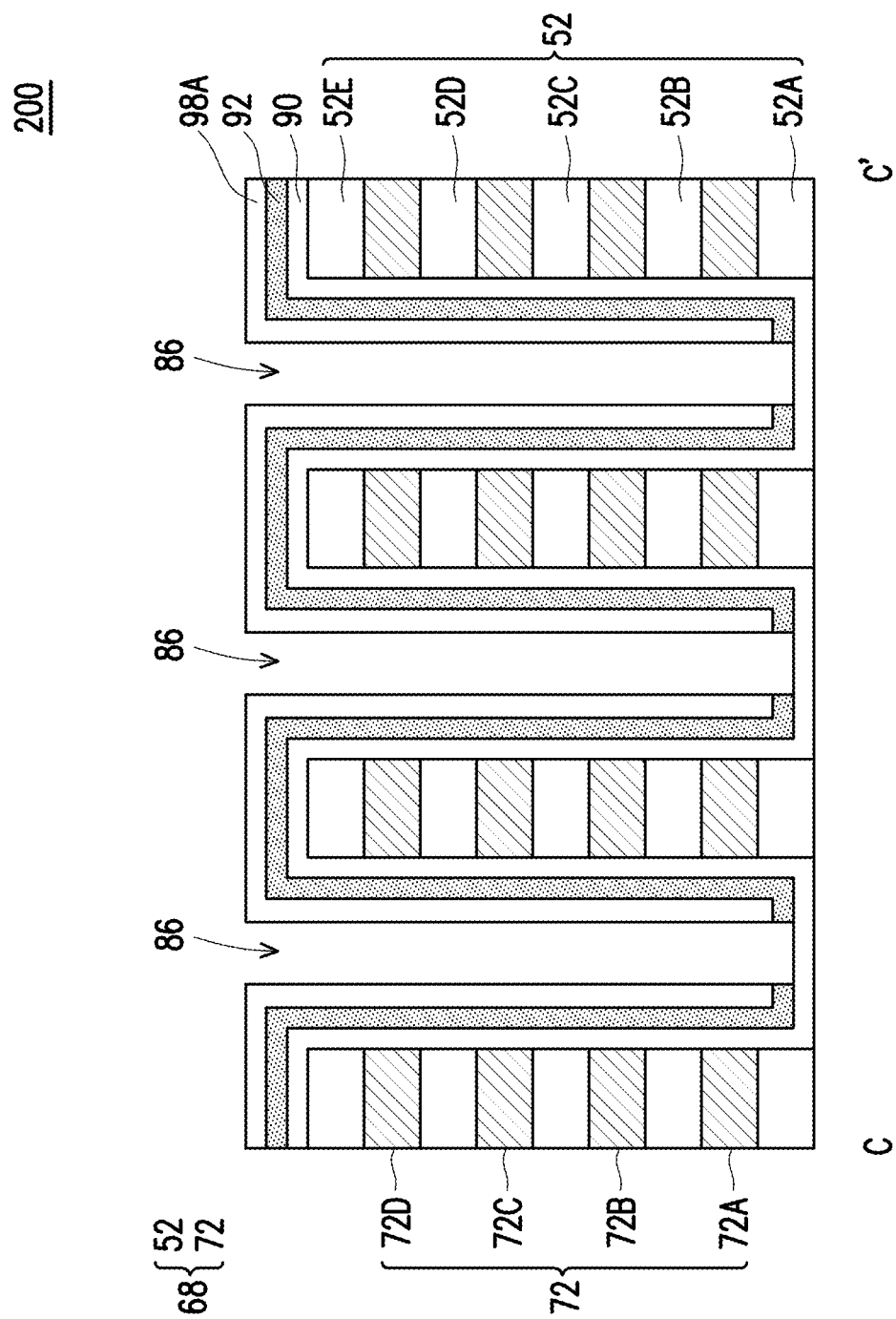

In FIG. 18, bottom portions of the dielectric material 98A and the channel layer 92 are removed in the trenches 86. The removal process includes an acceptable etching process, such as a dry etch (e.g., RIE, NBE, the like), a wet etch, the like, or a combination thereof. The etching may be anisotropic. In some embodiments, the top portions of the dielectric material 98A and the channel layer 92 are removed from the strip-shaped staircase structures 68. In some embodiments, removal process includes a combination of photolithography and etching.

Accordingly, the remaining dielectric material 98A and the channel layer 92 may expose portions of the memory material layer 90 on bottom surfaces of the trenches 86. Thus, portions of the channel layer 92 on opposing sidewalls of the trenches 86 may be separated from each other, which improves isolation between the memory cells 202 of the memory device 200 (see FIG. 1A).

Figure 19:
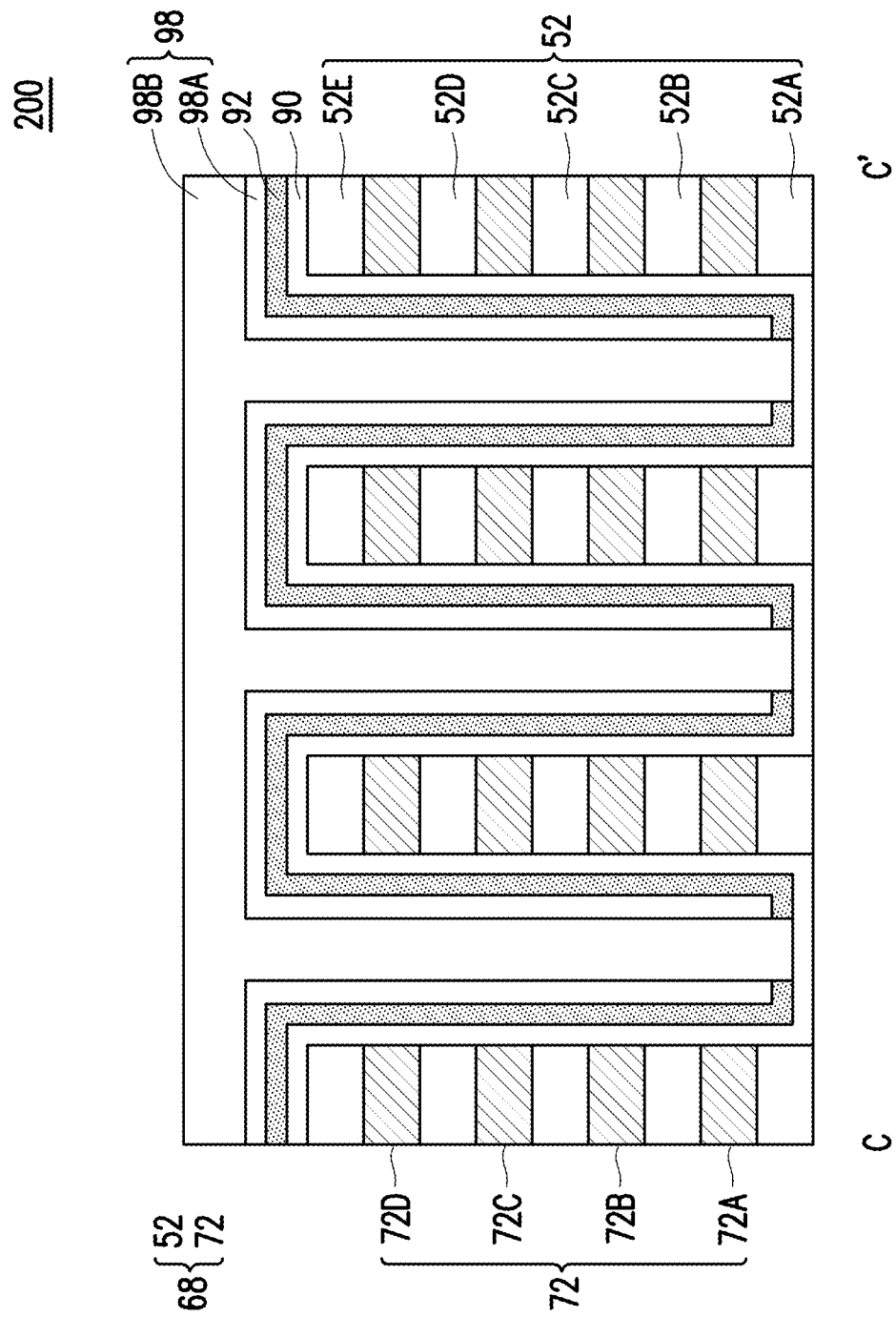

In FIG. 19, a dielectric material 98B is deposited to completely fill the trenches 86. The dielectric material 98B may be formed of one or more materials and by processes the same as or similar to those of the dielectric material 98A. In some embodiments, the dielectric material 98B and the dielectric material 98A include different materials.

Figure 20A:
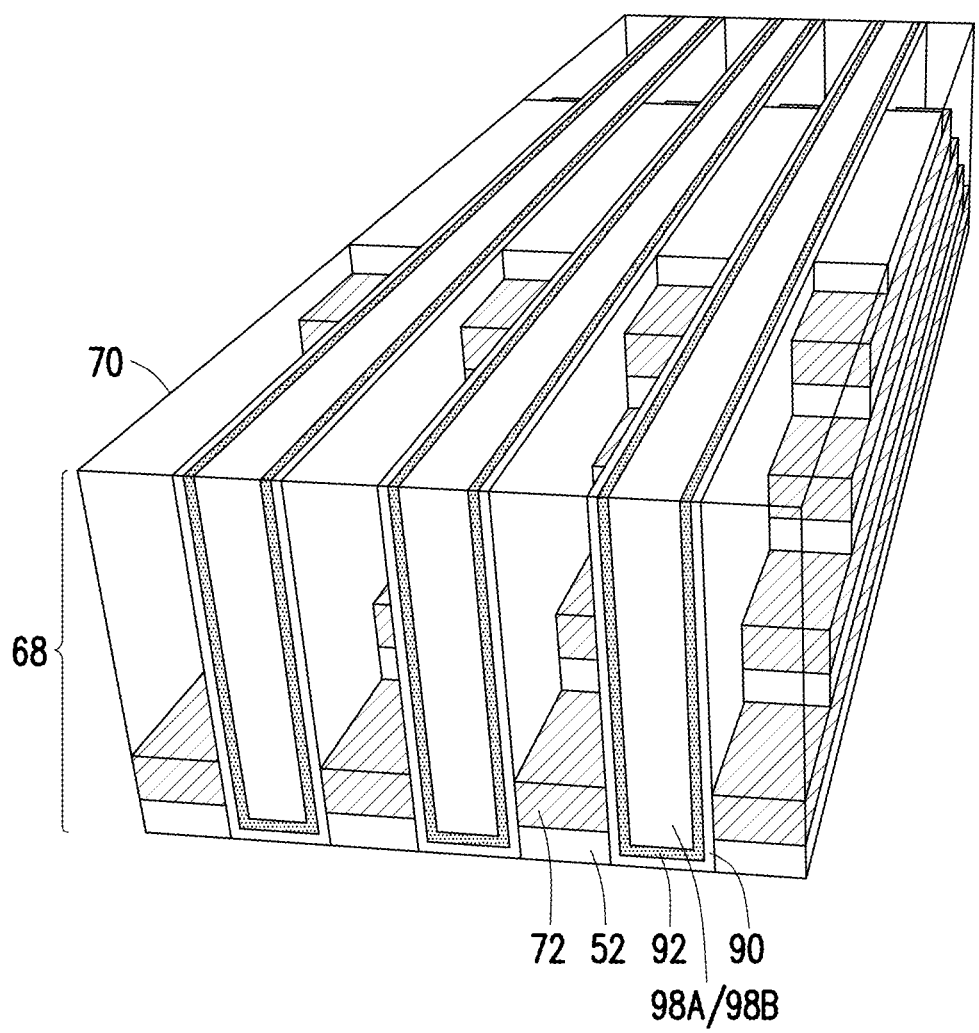
Figure 20B:
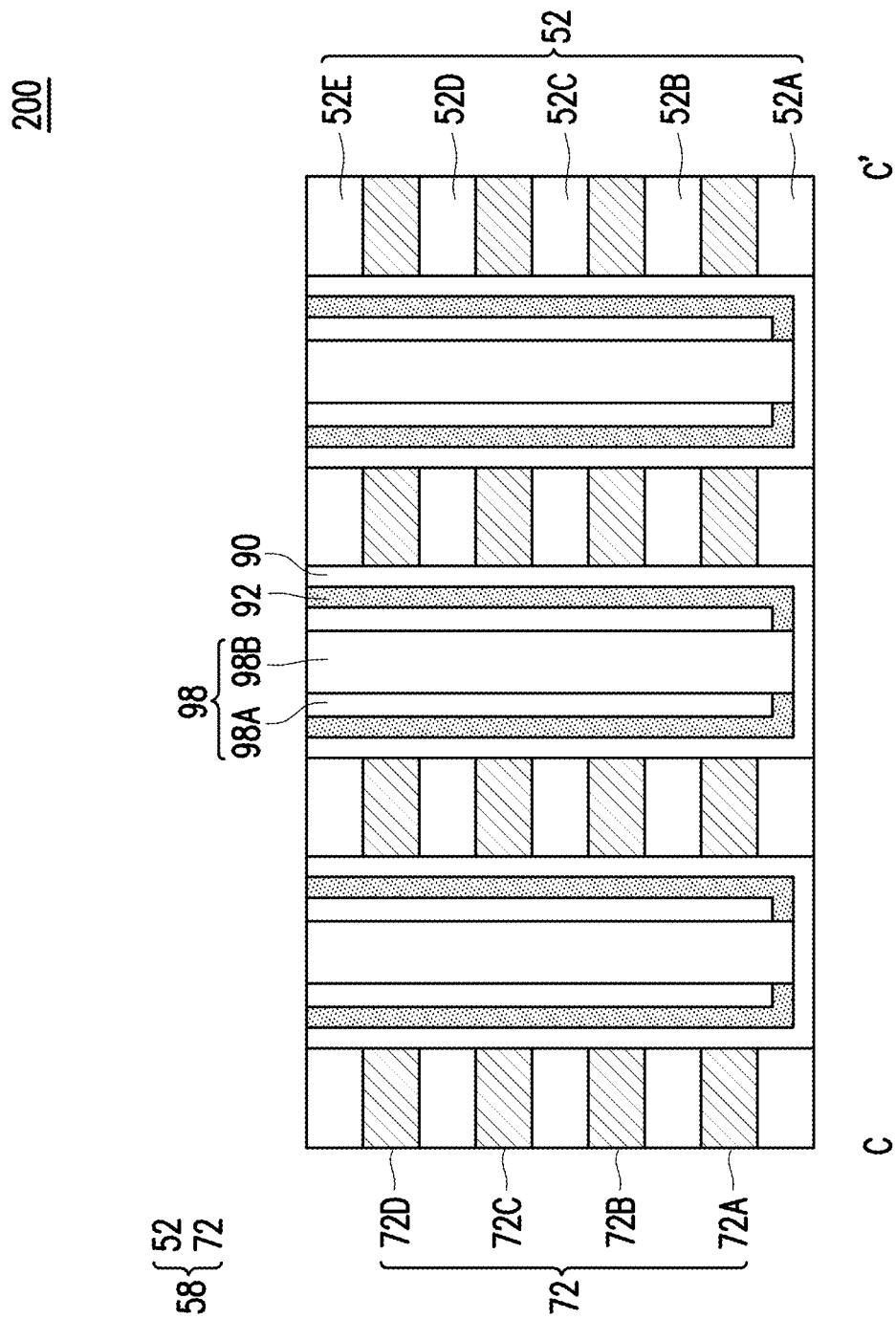

In FIGS. 20A and 20B, a removal process is applied to the dielectric materials 98A/98B, the channel layer 92, and the memory material layer 90 to remove excess materials over the strip-shaped staircase structures 68. In some embodiments, a planarization process such as a CMP, an etch-back process, combinations thereof, or the like may be utilized. The planarization process exposes the strip-shaped staircase structures 68 such that top surfaces of the strip-shaped staircase structures 68 (e.g., the dielectric layer 52E), the memory material layer 90, the channel layer 92, the dielectric materials 98A/98B, and the IMD 70 are level after the planarization process is complete.

Figure 22A:
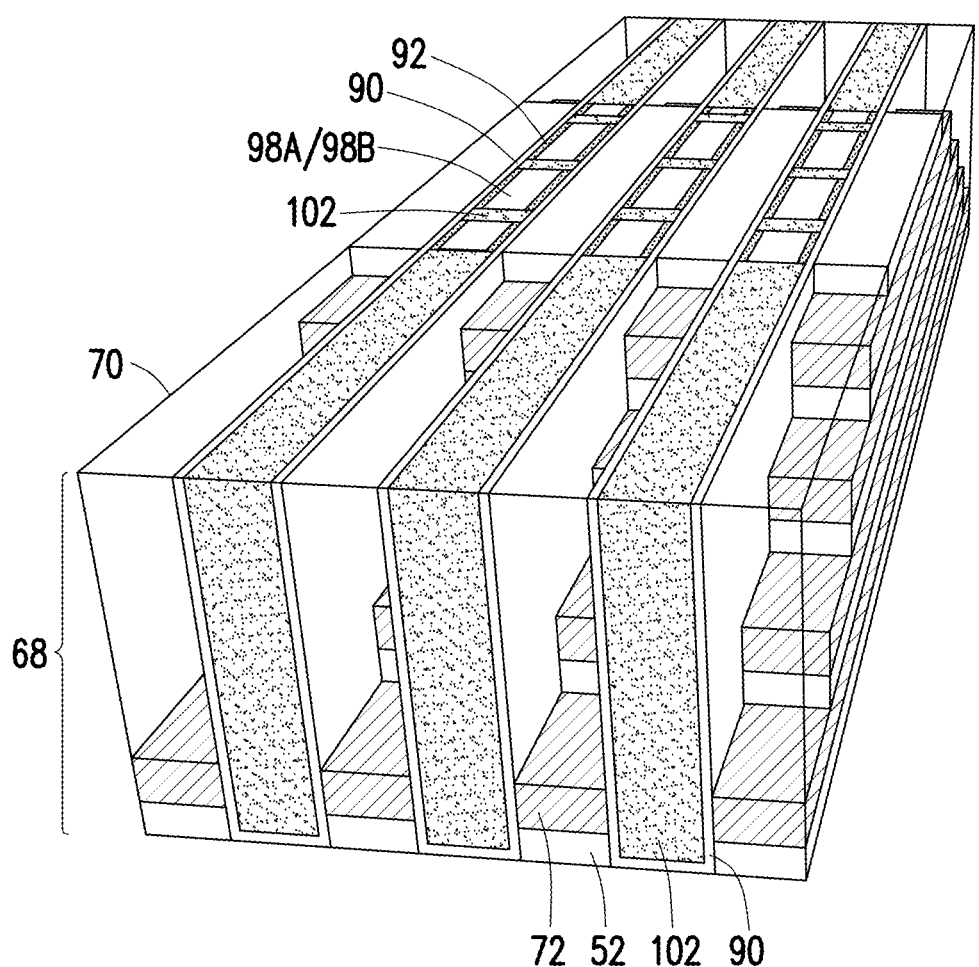
Figure 22B:
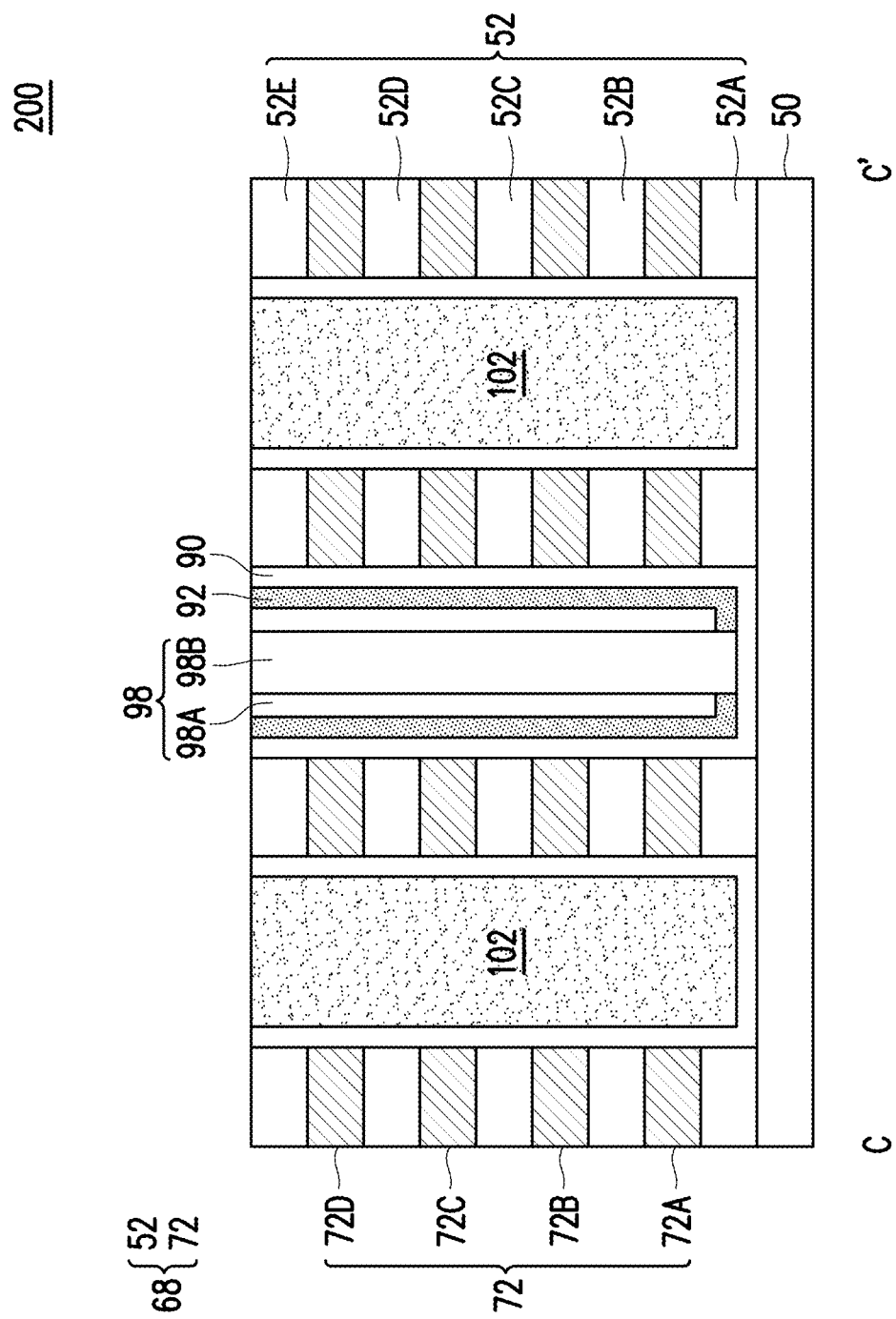
Figure 23A:
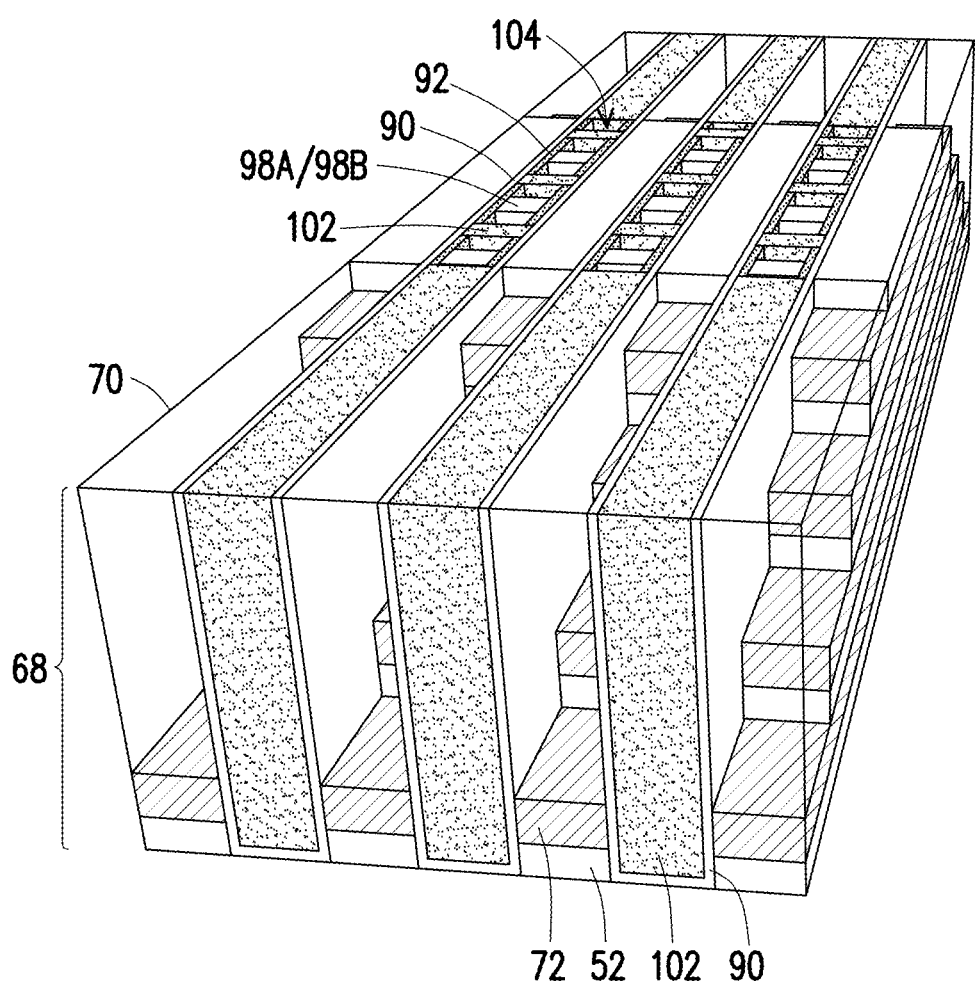
Figure 23B:
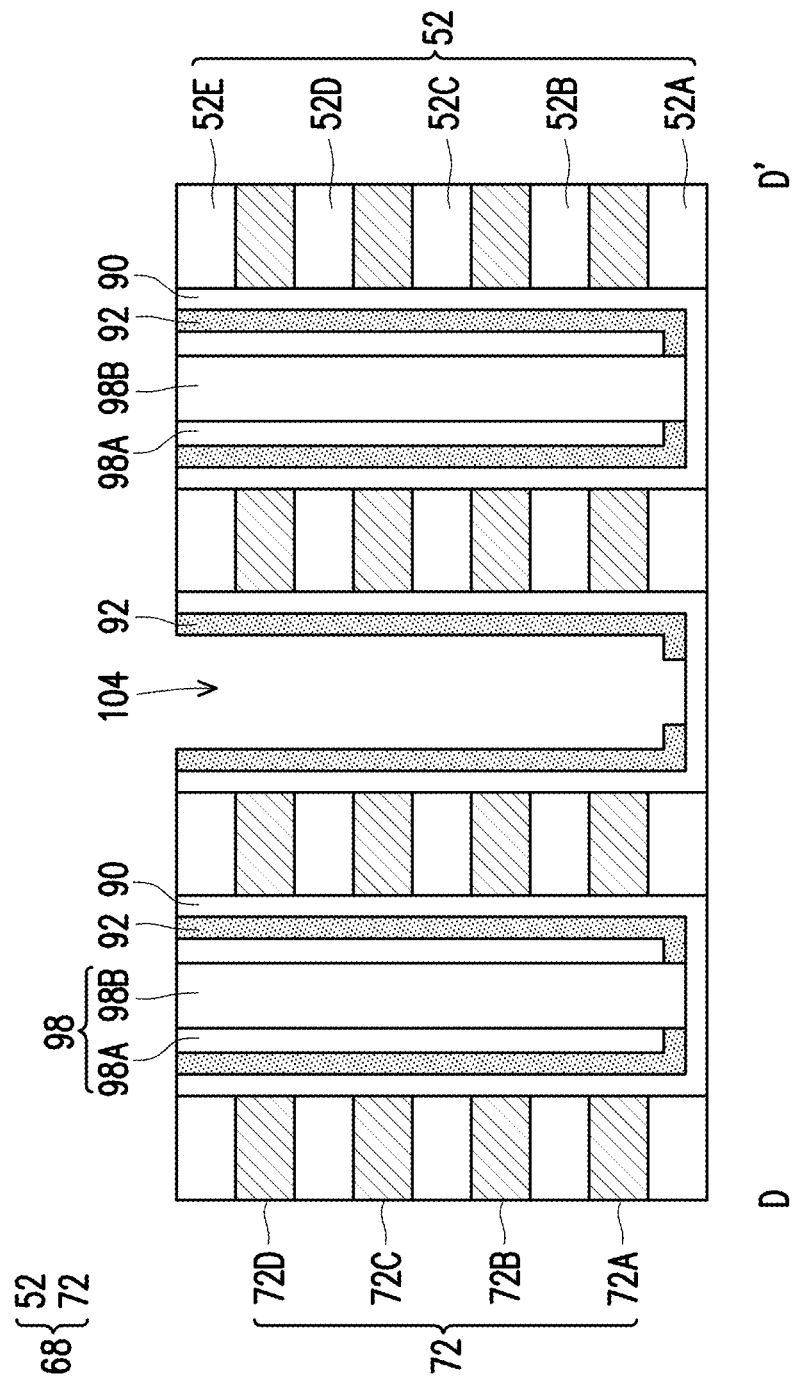
Figure 24A:
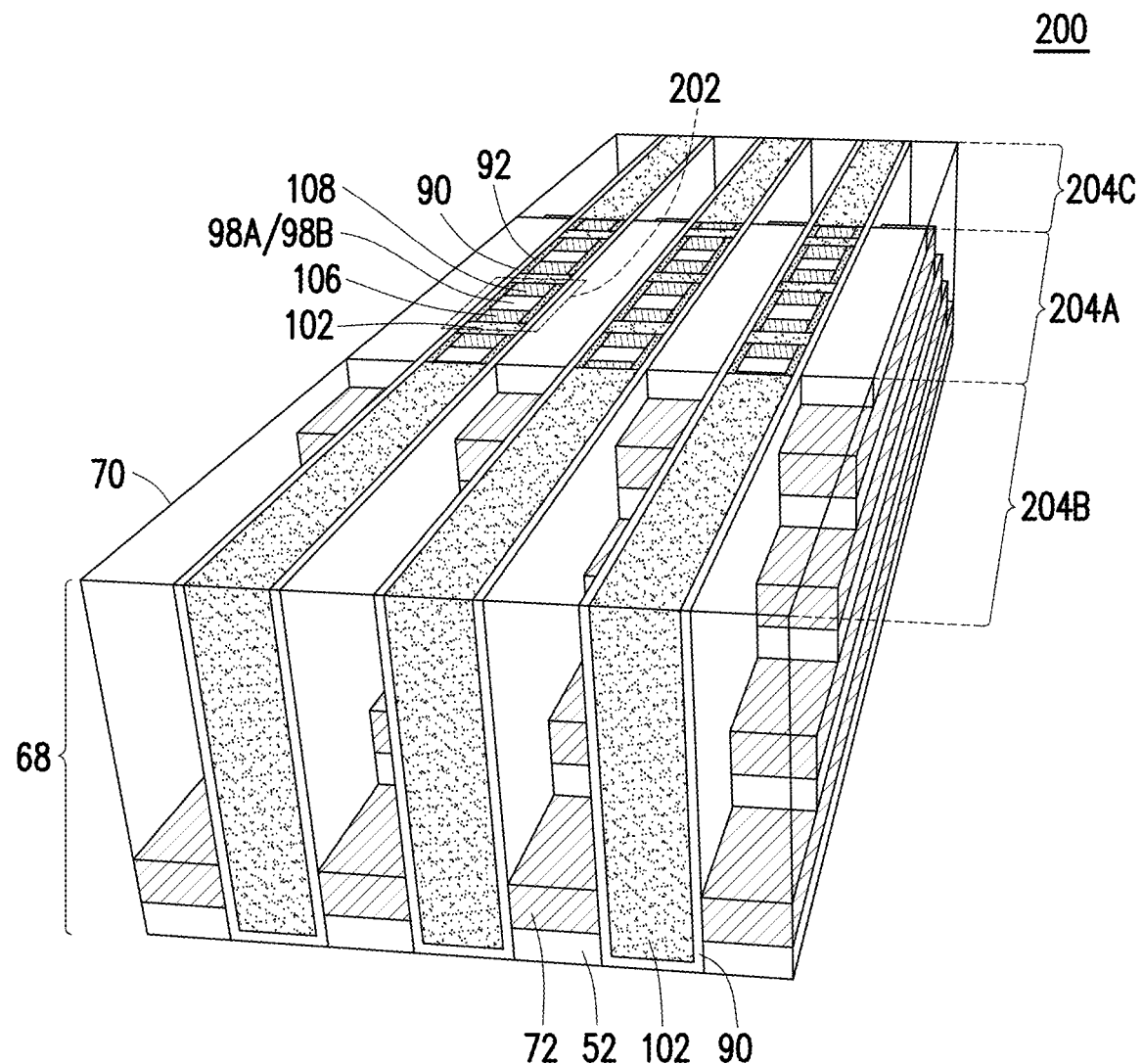
Figure 24B:
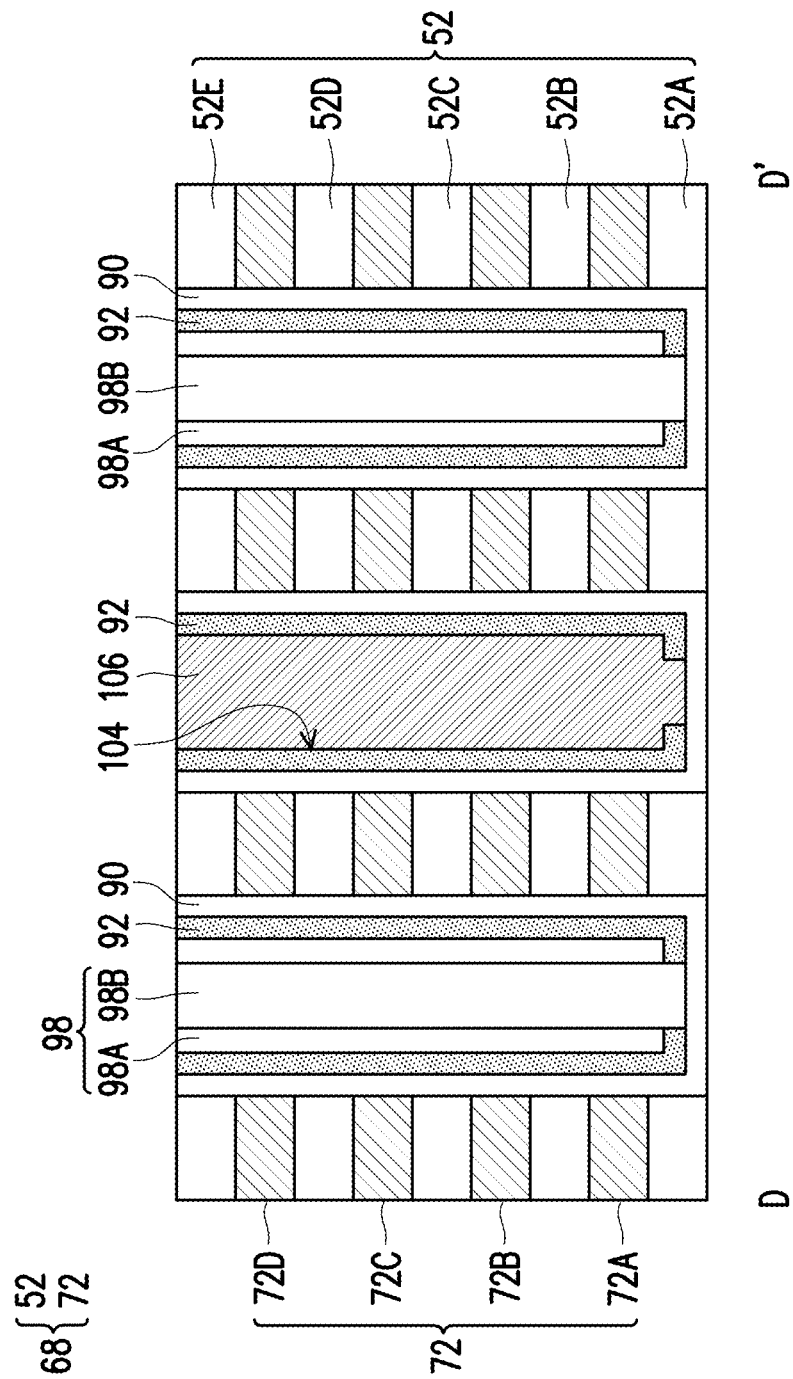

FIGS. 21A through 24B illustrate intermediate steps of manufacturing conductive pillars 106 and 108 (e.g., source/drain pillars) in the memory device 200. The conductive pillars 106 and 108 may extend along a direction perpendicular to the conductive lines 72 such that individual cells of the memory device 200 may be selected for read and write operations. FIGS. 21A, 22A, 23A and 24A are illustrated in a partial three-dimensional view. In FIGS. 21B and 22B, cross-sectional views are provided along line C-C' of FIG. 1A. In FIGS. 23B and 24B, cross-sectional views are provided along line D-D' of FIG. 1A.

Figure 21A:
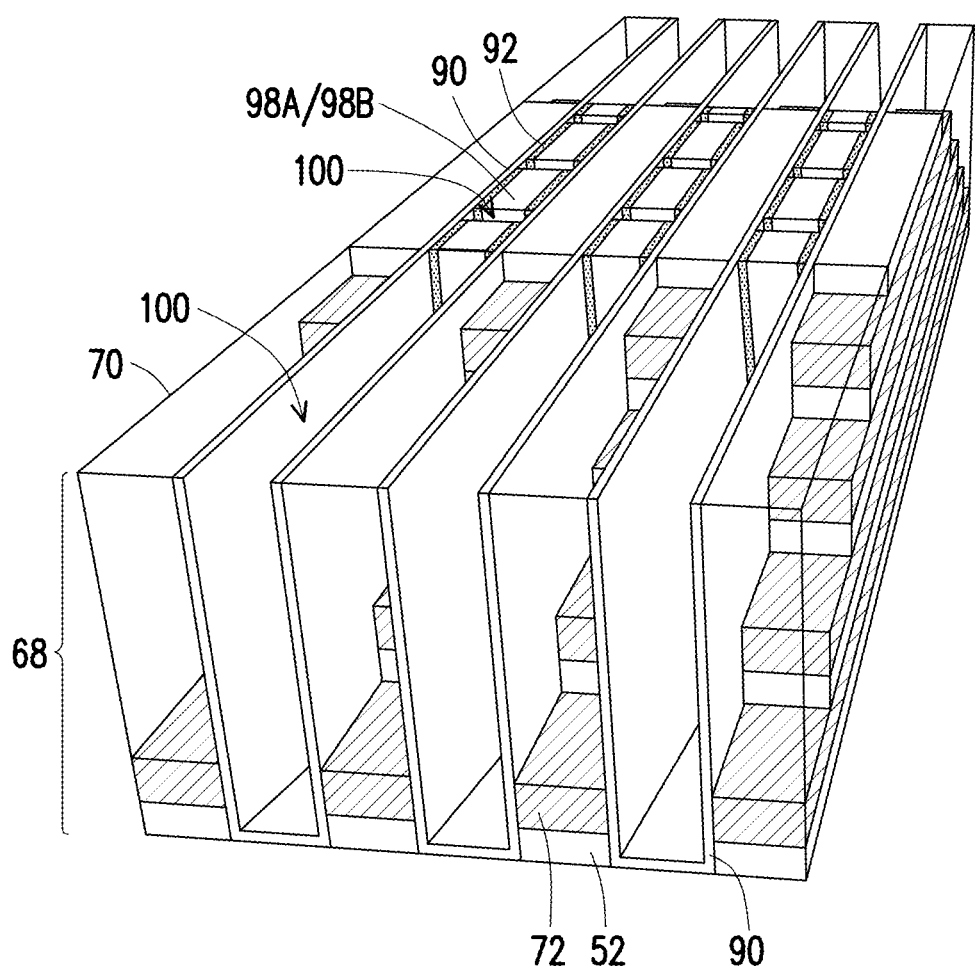
Figure 21B:
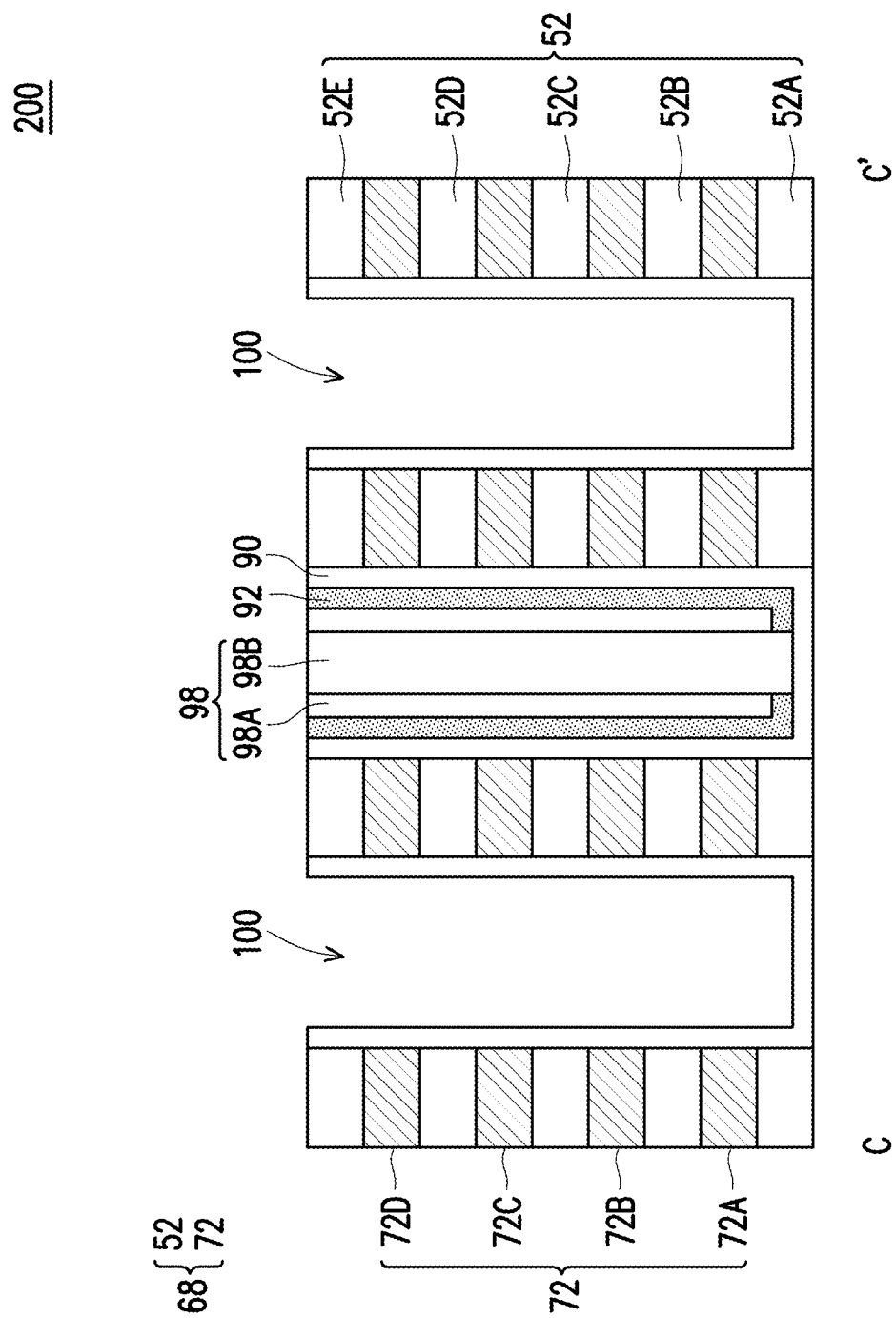

In FIGS. 21A and 21B, trenches 100 are patterned through the channel layer 92 and the dielectric materials 98A/98B. Patterning the trenches 100 may be performed through a combination of photolithography and etching, for example. The trenches 100 may be disposed between opposing sidewalls of the memory material layer 90, and the trenches 100 may physically separate adjacent stacks of memory cells in the memory device 200 (see FIG. 1A).

As illustrated in FIG. 21A, the trenches 100 may be formed in peripheral areas adjacent the IMD 70 by patterning the dielectric materials 98 and the OS layer 92. Dielectric materials (such as the dielectric materials 102, discussed below with respect to FIGS. 22A and 22B) may be subsequently formed in the trenches 100 in the peripheral areas adjacent the IMD 70 and the dielectric materials may be subsequently patterned to form conductive contacts (such as the conductive contacts 110, discussed below with respect to FIGS. 25A through 25D) to underlying structures, such as the interconnect structures 320.

In FIGS. 22A and 22B, dielectric materials 102 are formed in the trenches 100. In some embodiments, an isolation layer is deposited over the strip-shaped staircase structures 68 filling in the trenches 100. The isolation layer may include, for example, silicon oxide, silicon nitride, silicon oxynitride, or the like, which may be deposited by CVD. PVD, ALD, PECVD, or the like. The isolation layer may extend along sidewalls and bottom surfaces of the trenches 100 over the channel layer 92. After deposition, a planarization process (e.g., a CMP, etch back, or the like) may be performed to remove excess portions of the isolation layer. In the resulting structure, top surfaces of the strip-shaped staircase structures 68 (e.g., dielectric layer 52E), the memory material layer 90, the channel layer 92, and the dielectric materials 102 may be substantially level (e.g., within process variations). In some embodiments, materials of the dielectric materials 98A/98B and dielectric materials 102 may be selected so that they may be etched selectively relative each other. For example, in some embodiments, the dielectric materials 98A/98B include oxide and the dielectric materials 102 include nitride. In some embodiments, the dielectric materials 98A/98B include nitride and the dielectric materials 102 include oxide. Other materials are also possible.

In FIGS. 23A and 23B, trenches 104 are defined for the subsequently formed the conductive pillars 106 and 108. The trenches 104 are formed by patterning the dielectric materials 98A/98B with a combination of photolithography and etching, for example. In some embodiments, a photoresist (not shown) is formed over the strip-shaped staircase structures 68, the dielectric materials 98A/98B, the dielectric materials 102, the channel layer 92, and the memory material layer 90. In some embodiments, the photoresist is patterned by an acceptable photolithography technique to define openings (not shown). Each of the openings may expose the corresponding dielectric material 102 and two separate regions of the dielectric materials 98A/98B beside the dielectric material 102. In this way, each of the openings may define a pattern of a conductive pillar 106 and an adjacent conductive pillar 108 that are separated by the dielectric materials 102.

Subsequently, portions of the dielectric materials 98A/98B exposed by the openings may be removed by an acceptable etching process, such as by a dry etch (e.g., RIE, NBE, the like), a wet etch, the like, or a combination thereof. The etching may be anisotropic. The etching process may use an etchant that etches the dielectric materials 98A/98B without significantly etching the dielectric materials 102. As a result, even though the openings expose the dielectric materials 102, the dielectric materials 102 may not be significantly removed. Patterns of the trenches 104 may correspond to the conductive pillars 106 and 108 (see FIGS. 24A and 24B). After the trenches 104 are patterned, the photoresist may be removed by ashing, for example.

In FIGS. 24A and 24B, the trenches 104 are filled with a conductive material to form the conductive pillars 106 and 108. The conductive material may include copper, titanium, titanium nitride, tantalum, tantalum nitride, tungsten, ruthenium, aluminum, combinations thereof, or the like, which may be formed using, for example, CVD, ALD, PVD, PECVD, or the like. After the conductive material is deposited, a planarization (e.g., a CMP, etch back, or the like) may be performed to remove excess portions of the conductive material, thereby forming the conductive pillars 106 and 108. In the resulting structure, top surfaces of the strip-shaped staircase structures 68 (e.g., the dielectric layer 52E), the memory material layer 90, the channel layer 92, the conductive pillars 106, and the conductive pillars 108 may be substantially level (e.g., within process variations). In some embodiments, the conductive pillars 106 correspond to and are electrically connected to the bit lines in the memory device, and the conductive pillars 108 correspond to correspond to and are electrically connected to the source lines in the memory device 200. In alternative embodiments, the conductive pillars 106 correspond to and are electrically connected to the source lines in the memory device, and the conductive pillars 108 correspond to correspond to and are electrically connected to the bit lines in the memory device 200.

As illustrated in FIG. 24A, the memory device 200 may include a memory cell region 204A, a first staircase region 204B and a second staircase region 204C. The first staircase region 204B and the second staircase region 204C include portions of the IMD 70, portions of the dielectric materials 102, portions of the memory material layer 90, portions of the conductive lines 72A-72D, and portions of the dielectric layers 52A-52D. The memory cell region 204A includes portions of the conductive lines 72A-72D, portions of the dielectric layers 52A-52D, the dielectric layer 52E, the conductive lines 106, the conductive lines 108, the dielectric materials 98, portions of the dielectric materials 102, portions of the memory material layer 90, and the channel layer 92.

In some embodiments, stacked memory cells 202 are formed in the memory device 200, as shown in FIG. 24A. Each memory cell 202 includes a gate electrode (e.g., a portion of a corresponding conductive line 72), a gate dielectric (e.g., a portion of a corresponding memory material layer 90), a channel region (e.g., a portion of a corresponding channel layer 92), and source/drain pillars (e.g., portions of corresponding conductive pillars 106 and 108). The dielectric materials 102 isolates adjacent memory cells 202 in a same column and at a same vertical level. The memory cells 202 may be disposed in an array of vertically stacked rows and columns.

Figure 25A:
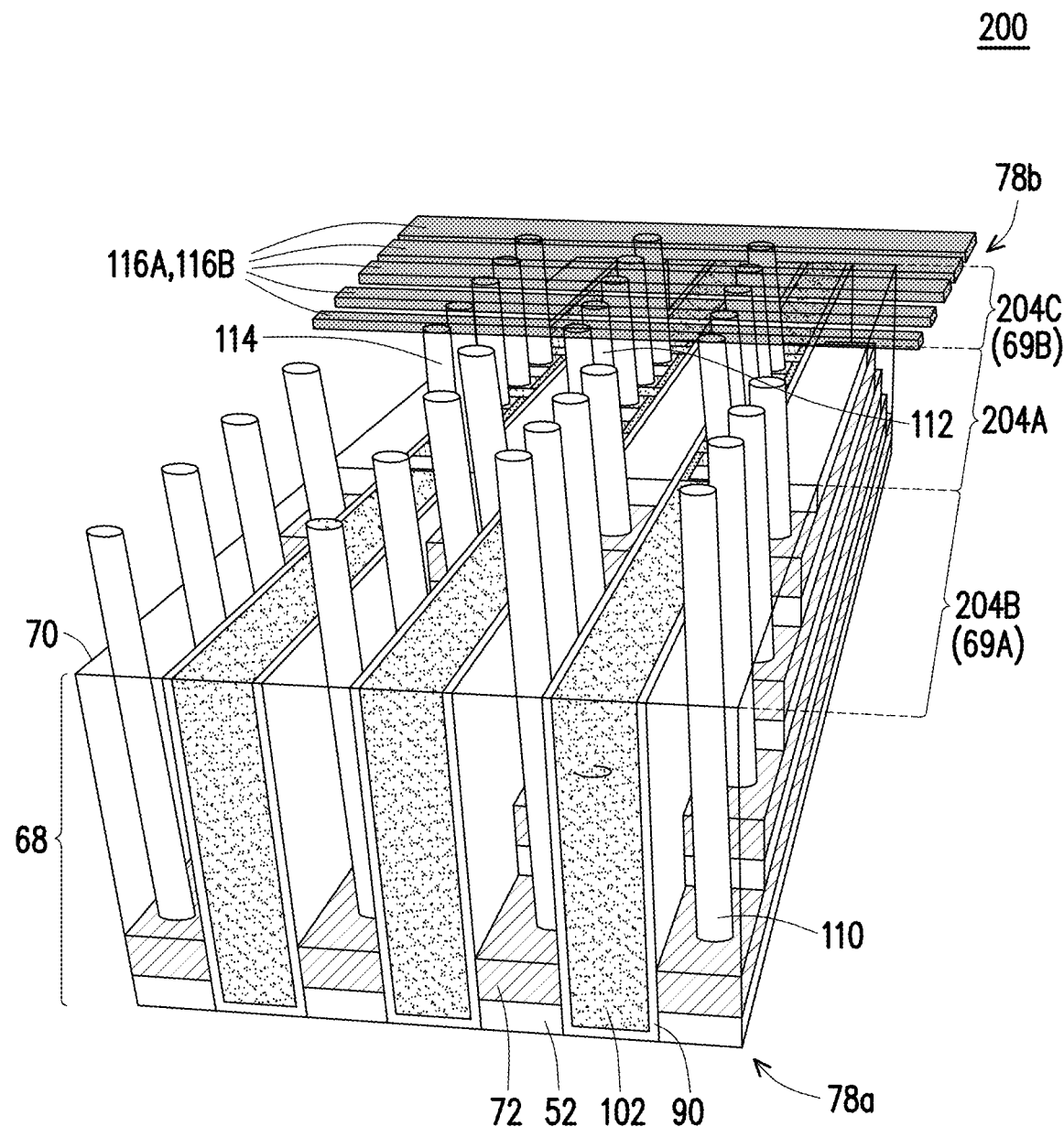
Figure 25B:
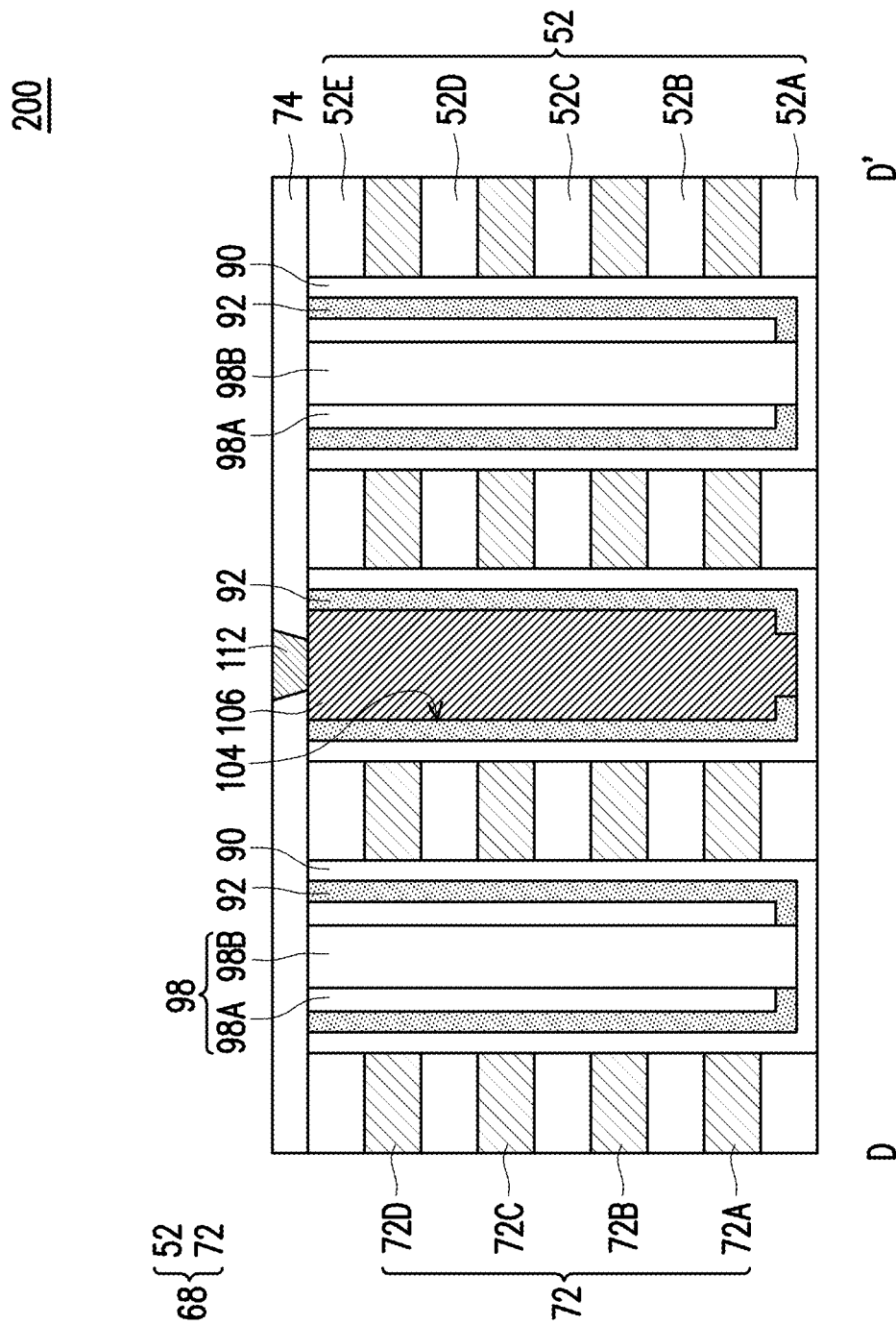
Figure 25C:
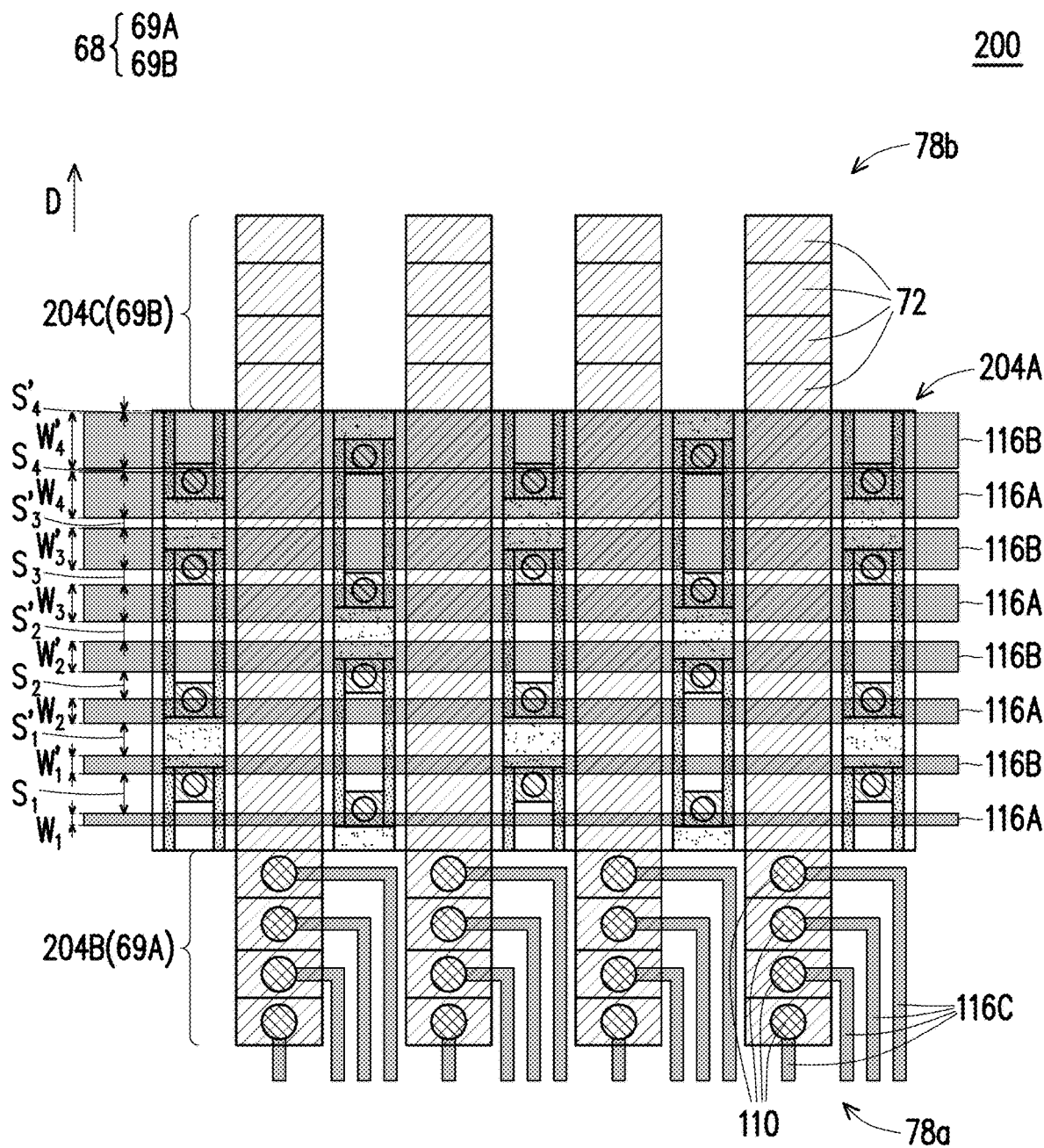
Figure 25D:
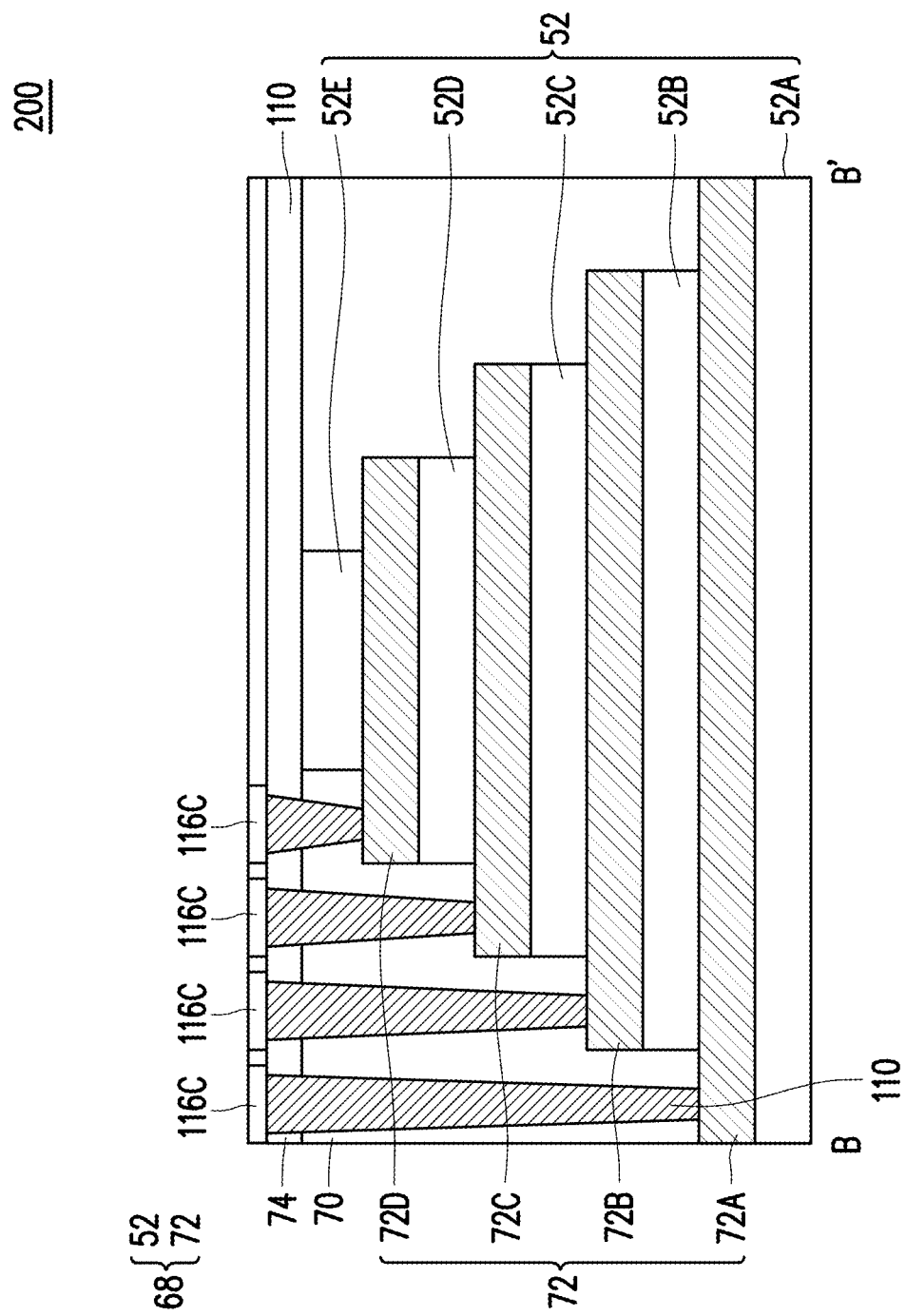

FIGS. 25A through 25D illustrate intermediate steps of manufacturing conductive contacts and conductive lines. FIG. 25A illustrates a perspective view of the memory device 200; FIG. 25B illustrates a cross-sectional view of the device along line D-D' of FIG. 1A; FIG. 25C illustrates a top-down view of the memory device 200; and FIG. 25D illustrates a cross-sectional view of the device along line B-B' of FIG. 1A.

In FIGS. 25A, 25B, 25C and 25D, an IMD 74 is formed on top surfaces of the strip-shaped staircase structures 68 (e.g., the dielectric layer 52E), the memory material layer 90, the channel layer 92, the conductive pillars 106, and the conductive pillars 108 and the IMD 70. The IMD 74 may be formed of a dielectric material, and may be deposited by any suitable method, such as CVD, PECVD, flowable CVD (FCVD), or the like. The dielectric material may include phospho-silicate glass (PSG), boro-silicate glass (BSG), boron-doped phospho-silicate glass (BPSG), undoped silicate glass (USG), or the like. Other dielectric materials formed by any acceptable process may be used. Thereafter, a removal process is applied to the IMD 74 to remove excess dielectric material over the strip-shaped staircase structures 68. In some embodiments, the removal process may be a planarization process, such as a chemical mechanical polish (CMP), an etch-back process, combinations thereof, or the like.

Then, conductive contacts 110, 112, and 114 are formed on the conductive lines 72, the conductive pillars 106, and the conductive pillars 108, respectively. In some embodiments, forming the conductive contacts 110, 112, and 114 includes patterning openings in the IMD 74 and the IMD 70 to expose portions of the conductive lines 72, the conductive pillars 106, and the conductive pillars 108 using a combination of photolithography and etching. A liner (not shown), such as a diffusion barrier layer, an adhesion layer, or the like, and a conductive material are formed in the openings. The liner may include titanium, titanium nitride, tantalum, tantalum nitride, or the like. The conductive material may include copper, a copper alloy, silver, gold, tungsten, cobalt, aluminum, nickel, or the like. A planarization process, such as a CMP, may be performed to remove excess material from the surface of the IMD 74. The remaining liner and conductive material form the conductive contacts 110, 112, and 114 in the openings. In some embodiments, the conductive contacts 110, 112, and 114 are formed simultaneously. In alternative embodiments, the conductive contacts 110, 112, and 114 are formed separately.

In some embodiments, as shown in FIGS. 25A, 25C and 25D, after forming the conductive contacts 110, 112, and 114, conductive lines 116A, 116B are formed over the IMD 74 in the memory cell region 204A, and conductive lines 116C are formed over the IMD 74 in at least one of the first staircase region 204B and the second staircase region 204C. As shown in FIGS. 25A and 25C, the conductive lines 116B and the conductive lines 116B may each extend in a direction perpendicular to the conductive lines 72. The conductive lines 116B are electrically connected to the conductive pillars 106 through the conductive contacts 112, and the conductive lines 116B are electrically connected to the conductive pillars 108 through the conductive contacts 114. The conductive lines 116C are electrically connected to the conductive lines 72 through the conductive contacts 110. In some embodiments, the conductive contacts 110, 112, and 114 and the conductive lines 116A, 116B, and 116C connect the memory device 200 to an underlying/overlying circuitry (e.g., control circuitry) and/or signal, power, and ground lines, respectively. Other conductive contacts or vias may be formed through the IMD 74 and the IMD 70 to electrically connect the conductive lines 116A, 116B, and 116C to the underlying active devices of the substrate. In alternative embodiments, routing and/or power lines to and from the memory device are provided by an interconnect structure formed over the memory device 200 in addition to or in lieu of the interconnect structure 320. In some embodiments, the conductive lines 116A, 116B, 116C are formed using a combination of photolithography and etching techniques. The conductive lines 116A, 116B, 116C may include copper, silver, gold, tungsten, aluminum, combinations thereof, or the like. In addition, the conductive lines 116A, 116B, 116C may have other configurations.

In some embodiments, the staircase shape of the conductive lines 72 provides a surface on each of the conductive lines 72 for conductive contacts 110 to land on. The conductive line 72 has opposite side 78a, 78b, and the conductive contact 110 for the conductive line 72 are disposed on one of the sides 78a, 78b. For example, as shown in FIGS. 25A and 25C, the conductive contacts 110 for the strip-shaped staircase structure 68 are disposed at the same side 78a of the conductive lines 72. In some embodiments, the opposite sides 78a and 78b are also referred to as opposite sides of the memory region 204A or opposite sides of the strip-shaped staircase structures 68. In some embodiments, the strip-shaped staircase structure 68 includes a staircase 69A in the first staircase region 204B and a staircase 69B in the second staircase region 204C. The conductive contacts 110 may be formed on the conductive lines 72 in at least one of the first staircase region 204B and the second staircase region 204C. In an embodiment in which the conductive contacts 110 for the strip-shaped staircase structure 68 are all disposed on the staircase 69A (as shown in FIGS. 25A and 25C), the staircase 69A is also referred to as a used staircase, and the staircase 69B is also referred to as a non-used staircase. In some embodiments, the conductive contacts 110 for the strip-shaped staircase structures 68 are all disposed at the same side (e.g., the side 78a). In alternative embodiments (not shown), some of the conductive contacts 110 for the strip-shaped staircase structures 68 are disposed at one side (e.g., the side 78a), and some of the conductive contacts 110 for the strip-shaped staircase structures 68 are disposed at the other side (e.g., the side 78b).

In some embodiments, the conductive contacts 110 electrically connect the conductive lines 72 to the conductive lines 116C and the underlying drivers (not shown) such as CMOS devices. In some embodiments, the drivers (e.g., words line drivers) are disposed corresponding to the conductive contacts 110. For example, the drivers are disposed at one of the opposite sides 78a, 78b of the conductive lines 72 (also referred to as opposite sides of the memory region 204A or opposite sides of the strip-shaped staircase structure 68). In some embodiments, the drivers for the strip-shaped staircase structure 68 are disposed under the memory device 200 at the side 78a in the first staircase region 204B. In an embodiment in which the drivers are disposed at single side (i.e., the side 78a or the side 78b) of the conductive lines 72, the strip-shaped staircase structure 68 is also referred to as a single-sided driving structure or a single-sided routing structure.

In some embodiments, the conductive lines 116A and the conductive lines 116B are alternately arranged over the staircase structures 68. The conductive lines 116A have widths $W_1, \ldots W_{n-1}$, and $W_n$, in which n is the total number of the conductive lines 116A over the strip-shaped staircase structure 68 and n is an integer larger than 1. The conductive line 116A which is closest to the side 78a/the conductive contacts 110/the drivers/the used staircase 69A has the width $W_1$, and the conductive line 116A which is farthest from the side 78a/the conductive contacts 110/the drivers/the used staircase 69A (also closest to the side 78b/the non-used staircase 69B) has the width $W_n$. In some embodiments, the strip-shaped staircase structure 68 is a single-sided driving structure, the widths $W_1, \ldots W_{n-1}$, and $W_n$ of the conductive lines 116A are increased as the conductive lines 116A become far away from the side (i.e., the side 78a or the side 78b) at which the drivers are disposed, namely $W_1 < \ldots < W_{n-1} < W_n$. For example, as shown in FIG. 25C, the drivers are disposed at the side 78a, and the widths $W_1$, $W_2$, $W_3$, and $W_4$ of the conductive lines 116A are increased as the conductive lines 116A become far away from the side 78a, namely $W_1 < W_2 < W_3 < W_4$. In some embodiments, the strip-shaped staircase structure 68 is a single-sided driving structure, the widths $W_1, \ldots W_{n-1}$, and $W_n$ of the conductive lines 116A are gradually increased along a direction from the used staircase 69A to the non-used staircase 69B. In some embodiments, the widths $W_1, \ldots W_{n-1}$, and $W_n$ are in a range of about 10 nm to about 20 nm. In some embodiments, the width $W_n$ is substantially equal to the width $W_1$ and $W_1/n$, namely $W_n = W_1 + W_1/n$. A ratio of $W_n/W_1$ may be in a range of about 5 to about 20.

In some embodiments, spacings $S_1, \ldots S_{n-1}$, and $S_n$ of the conductive lines 116A, are different. The spacings $S_1, \ldots S_{n-1}$, and $S_n$ may be decreased as the spacings $S_1, \ldots S_{n-1}$, and $S_n$ become far away from the side 78a at which the drivers are disposed, namely $S_1 > \ldots > S_{n-1} > S_n$. For example, as shown in FIG. 25C, the drivers are disposed at the side 78a, and the spacings $S_1$, $S_2$, $S_3$, and $S_4$ are decreased as the spacings $S_1$, $S_2$, $S_3$, and $S_4$ become far away from the side 78a, namely $S_1 > S_2 > S_3 > S_4$. A ratio of width $W_1, \ldots W_{n-1}$, $W_n$ to respective spacing $S_1, \ldots S_{n-1}$, $S_n$ may be in a range of about 1 to about 20. In some embodiments, the total of the width $W_1, \ldots W_{n-1}$, $W_n$ and the respective spacing $S_1, \ldots S_{n-1}$, $S_n$ of the conductive line 116A is substantially the same, namely $W_1 + S_1 = \ldots = W_{n-1} + S_{n-1} = W_n + S_n$. In alternative embodiments, the spacings $S_1, \ldots S_{n-1}$, and $S_n$ of the conductive lines 116A are constant.

The conductive lines 116B have widths $W'_1, \ldots W'_{n-1}$, and $W'_n$, in which n is the total number of the conductive lines 116B over the strip-shaped staircase structure 68 and n is an integer larger than 1. The conductive line 116B which is closest to the side 78a/the conductive contacts 110/the drivers/the used staircase 69A has the width $W'_1$, and the conductive line 116B which is farthest from the side 78a/the conductive contacts 110/the drivers/the used staircase 69A (also closest to the side 78b/the non-used staircase 69B) has the width $W'_n$. In some embodiments, the strip-shaped staircase structure 68 is a single-sided driving structure, the widths $W'_1, \ldots W'_{n-1}$, and $W'_n$ of the conductive lines 116B are increased as the conductive lines 116B become far away from the side (i.e., the side 78a or the side 78b) at which the drivers are disposed, namely $W'_1 < \ldots < W'_{n-1} < W'_n$. For example, as shown in FIG. 25C, the drivers are disposed at the side 78a, and the widths $W'_1$, $W'_2$, $W'_3$, and $W'_4$ of the conductive lines 116B are increased as the conductive lines 116B become far away from the side 78a, namely $W'_1 < W'_2 < W'_3 < W'_4$. In some embodiments, the strip-shaped staircase structure 68 is a single-sided driving structure, the widths $W'_1, \ldots W'_{n-1}$, and $W'_n$ of the conductive lines 116B are gradually increased along a direction from the used staircase 69A to the non-used staircase 69B. In some embodiments, the widths $W'_1, \ldots W'_{n-1}$, and $W'_n$ are in a range of about 10 nm to about 20 nm. In some embodiments, the width $W'_n$ is substantially equal to the width $W'_1$ and $W'_1/n$, namely $W'_n = W'_1 + W'_1/n$. A ratio of $W'_n/W'_1$ may be in a range of about 5 to about 20.

In some embodiments, spacings $S'_1, \ldots S'_{n-1}$, and $S'_n$ of the conductive lines 116B, are different. The spacings $S'_1, \ldots S'_{n-1}$, and $S'_n$ may be decreased as the spacings $S'_1, \ldots S'_{n-1}$, and $S'_n$ become far away from the side 78a at which the drivers are disposed, namely $S'_1 > \ldots > S'_{n-1} > S'_n$. For example, as shown in FIG. 25C, the drivers are disposed at the side 78a, and the spacings $S'_1$, $S'_2$, $S'_3$, and $S'_4$ are decreased as the spacings $S'_1$, $S'_2$, $S'_3$, and $S'_4$ become far away from the side 78a, namely $S'_1 > S'_2 > S'_3 > S'_4$. A ratio of width $W'_1, \ldots W'_{n-1}$. $W'_n$ to respective spacing $S'_1, \ldots S'_{n-1}$, $S'_n$ may be in a range of about 1 to about 20. In some embodiments, the total of the width $W'_1, \ldots W'_{n-1}$. $W'_n$ and the respective spacing $S'_1, \ldots S'_{n-1}$, $S'_n$ of the conductive line 116B is substantially the same, namely $W'_1 + S'_1 = \ldots = W'_{n-1} + S'_{n-1} = W'_n + S'_n$. In alternative embodiments, the spacings $S'_1, \ldots S'_{n-1}$, and $S'_n$ of the conductive lines 116B are constant.

In some embodiments, the widths $W_1, W'_1, \ldots W_{n-1}, W'_{n-1}, W_n$, and $W'_n$ of the conductive lines 116A and 116B are increased as the conductive lines 116B and 116B become far away from the side 78a at which the drivers are disposed, namely $W_1 < W'_1 < \ldots < W_{n-1} < W'_{n-1} < W_n < W'_n$. For example, as shown in FIG. 25C, the widths $W_1$. $W_1$, $W'_1$. $W_2$, $W'_2$. $W_3$, $W'_3$. $W_4$, and $W'_4$ of the conductive lines 116A and 116B are increased as the conductive lines 116B and 116B become far away from the side 78a at which the drivers are disposed, namely $W_1 < W'_1 < W_2 < W'_2 < W_3 < W'_3 < W_4 < W'_4$. In some embodiments, the conductive lines 116A are bit lines, the conductive lines 116B are source lines. In alternative embodiments, the conductive lines 116A are source lines, the conductive lines 116B are bit lines. In alternative embodiments, the adjacent two of the conductive lines 116A and the conductive lines 116B have substantially the same width, namely $W_1 = W'_1, \ldots W_{n-1} = W'_{n-1}$, and $W_n = W'_n$. In some embodiments, the conductive lines 116A and the conductive lines 116B are alternately disposed over the staircase structures 68. However, the disclosure is not limited thereto. The conductive lines 116A and the conductive lines 116B are arranged corresponding to the conductive pillars 106 and 108. Additionally, in alternative embodiments, the conductive lines 116A are disposed over the staircase structures 68 while the conductive lines 116B are disposed under the staircase structures 68. In alternative embodiments, the conductive lines 116A are disposed under the staircase structures 68 while the conductive lines 116B are disposed over the staircase structures 68.

Generally, the memory device may have the worst bit which usually have a corresponding minimum read current. In some embodiments, by adjusting the widths of the conductive lines 116A, 116B, the resistance of the conductive lines 116A, 116B is optimized, and thus the worst bit performance in the memory device such as 3D ferroelectric memory device is improved.

Figure 26:
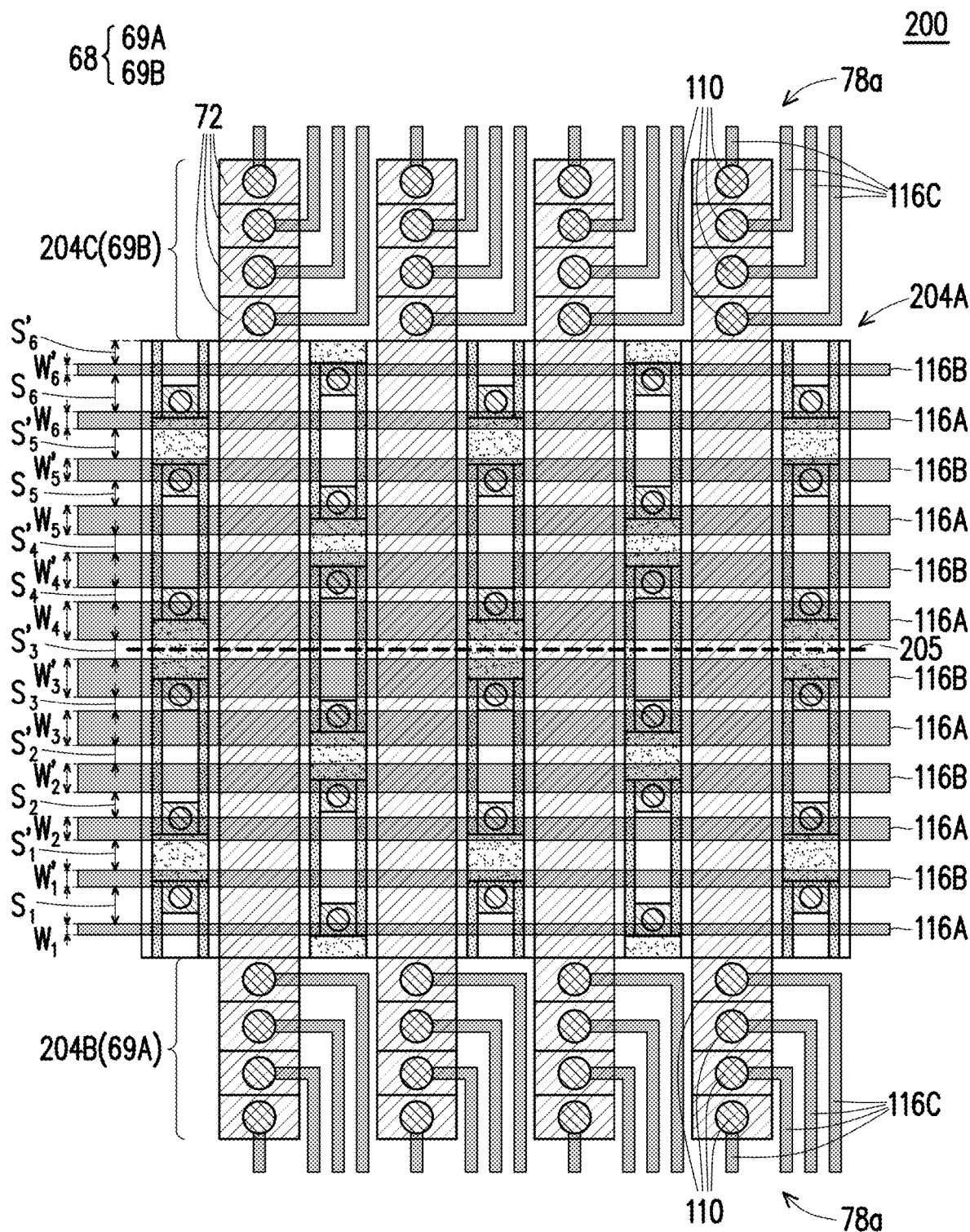
FIG. 26 illustrates a simplified top view of a memory device in accordance with alternative embodiments.

FIG. 26 illustrates an embodiment in which the drivers are disposed at both sides 78a, 78b of each of the conductive lines 72. The embodiment illustrated in FIG. 26 provides double the number of drivers to the conductive lines 72 and provides drivers for each of the conductive lines 72 in both of the first staircase region 204B and the second staircase region 204C. In some embodiments, the strip-shaped staircase structure 68 are also referred to as a double-sided driving structure or a double-sided routing structure. In such embodiments, the staircase 69A and the staircase 69B are both used staircase, and there is no non-used staircase in the strip-shaped staircase structures 68.

In some embodiments, the drivers are disposed at both sides 78a, 78b of the conductive lines 72. The conductive lines 116A and the conductive lines 116B may be alternately arranged, and the conductive lines 116A, 116B have widths $W_1, W'_1, \ldots W_{n-1}, W'_{n-1}$. $W_n$, and $W'_n$, in which n is an integer larger than 2. The conductive line 116A. 116B which is closest to the side 78a/the conductive contacts 110/the drivers/the first staircase region 204B has the width $W_1, W'_1$, and the conductive line 116A, 116B which is closest to the side 78b/the conductive contacts 110/the drivers/the second staircase region 204C has the width $W_n$, $W'_n$. In some embodiments, the drivers are disposed at both sides 78a, 78b, and a middle 205 between the staircase region 204B and the staircase region 204C is farthest from the sides 78a, 78b. The middle 205 between the staircase region 204B and the staircase region 204C may be also referred to as a middle of the memory region 204A. In some embodiments, the widths $W_1, W_1, W'_1, \ldots W_{n-1}, W'_{n-1}$. $W_n$, and $W'_n$ of the conductive lines 116A, 116B are increased as the conductive lines 116A, 116B become close to the middle 205 between the staircase region 204B and the staircase region 204C (also far away from the sides 78a, 78b at which the drivers are disposed). For example, as shown in FIG. 26, the conductive lines 116A, 116B have widths $W_1$, $W'_1$. $W_2$. $W'_2$, $W_3$, $W'_3$, $W_4$, $W'_4$, $W_5$, $W'_5$, $W_6$, and $W'_6$, and the widths $W_1, W'_1$. $W_2$, $W'_2$, $W_3$, $W'_3$, $W_4$, $W'_4$, $W_5$, $W'_5$, $W_6$, and $W'_6$ of the conductive lines 116A, 116B are increased as the conductive lines 116A, 116B become close to the middle 205, namely $W_1 < W_2 < W_3$, $W_6 < W_5 < W_4$. $W'_1 < W'_2 < W'_3$ and $W'_6 < W'_5 < W'_4$. In an embodiment in which the conductive lines 116A and 116B are arranged adjacently, the widths $W_1, W'_1, W_2, W'_2$. $W_3$, $W'_3$, $W_4$, $W'_4$, $W_5$, $W'_5$. $W_6$, and $W'_6$ of the conductive lines 116A, 116B are increased as the conductive lines 116A, 116B become close to the middle 205, namely $W_1 < W'_1 < W_2 < W'_2 < W_3 < W'_3$ and $W'_6 < W_6 < W'_5 < W_5 < W'_4 < W_4$. In some embodiments, the conductive lines 116A, 116B opposite to each other with respect to the middle 205 have substantially the same width, for example, as shown in FIG. 26, $W_1 = W'_6, W_2 = W'_5, W_3 = W'_4, W_4 = W'_3, W_5 = W'_2$, and $W_6 = W'_1$. In alternative embodiments, the conductive lines 116A, 116B opposite to each other with respect to the middle 205 have different widths. In some embodiments, the conductive lines 116A, 116B are symmetrically arranged with respect to the middle 205 between the staircase region 204B and the staircase region 204C. However, the disclosure is not limited thereto. In some embodiments, the total number of the conductive lines 116A, 116B may be odd or even, and the widths of other conductive lines 116A and 116B are decreased as the conductive lines 116A and 116B become far away from the middle 205. In some embodiments, the widths $W_1$, $W'_1, \ldots, W_{n-1}, W'_{n-1}, W_n,$ and $W'_n$ are in a range of about 10 nm to about 20 nm.

In some embodiments, the spacings $S_1, \ldots, S_{n-1},$ and $S_n$ of the conductive lines 116A are increased as the spacings $S_1, \ldots, S_{n-1},$ and $S_n$ become close to the middle 205, and the spacings $S'_1, \ldots, S'_{n-1},$ and $S'_n$ of the conductive lines 116B are increased as the spacings $S'_1, \ldots, S'_{n-1},$ and $S'_n$ become close to the middle 205. For example, as shown in FIG. 26, the conductive lines 116A, 116B have spacings $S_1$, $S'_1$, $S_2$, $S'_2$, $S_3$, $S'_3$, $S_4$, $S'_4$, $S_5$, $S'_5$, $S_6$, and $S'_6$ and the spacings $S_1$, $S'_1$, $S_2$, $S'_2$, $S_3$, $S'_3$, $S_4$, $S'_4$, $S_5$, $S'_5$, $S_6$, and $S'_6$ are increased as the spacings become close to the middle 205, namely $S_1>S_2>S_3$, $S_6>S_5>S_4$, $S'_1>S'_2>S'_3$ and $S'_6>S'_5>S'_4$. In an embodiment in which the conductive lines 116A and 116B are arranged adjacently, the spacings $S'_1$, $S_2$, $S'_2$, $S_3$, $S'_3$, $S_4$, $S'_4$, $S_5$, $S'_5$, $S_6$, and $S'_6$ are increased as the spacings become close to the middle 205, namely $S_1>S'_1>S_2>S'_2>S_3>S'_3$ and $S'_6>S_6>S'_5>S_5>S'_4>S_4$. In alternative embodiments, the spacings $S_1, S'_1, \ldots, S_{n-1}, S'_{n-1}, S_n,$ and $S'_n$ are constant. A ratio of width $W_1, W'_1, \ldots, W_{n-1}, W'_{n-1}, W_n, W'_n$ to respective spacing $S_1, S'_1, \ldots, S_{n-1}, S'_{n-1}, S_n, S'_n$ may be in a range of about 1 to about 20. In some embodiments, the total of the width $W_1, W'_1, \ldots, W_{n-1}, W'_{n-1}, W_n, W'_n$ and the respective spacing $S_1, S'_1, \ldots, S_{n-1}, S'_{n-1}, S_n, S'_n$ is substantially the same, namely $W_1+S_1= \ldots =W_{n-1}+S_{n-1}=W_n+S_n=W'_1+S'_1= \ldots =W'_{n-1}+S'_{n-1}=W'_n+S'_n$. In some embodiments, the conductive lines 116A and the conductive lines 116B are alternately disposed over the staircase structures 68. However, the disclosure is not limited thereto. The conductive lines 116A and the conductive lines 116B are arranged corresponding to the conductive pillars 106 and 108. Additionally, in alternative embodiments, the conductive lines 116A are disposed over the staircase structures 68 while the conductive lines 116B are disposed under the staircase structures 68. In alternative embodiments, the conductive lines 116A are disposed under the staircase structures 68 while the conductive lines 116B are disposed over the staircase structures 68.

Generally, the memory device may have the worst bit which usually have a corresponding minimum read current. In some embodiments, by adjusting the widths of the conductive lines 116A, 116B, the resistance of the conductive lines 116A, 116B is optimized, and thus the worst bit performance in the memory device such as 3D ferroelectric memory device is improved.

Figure 27:
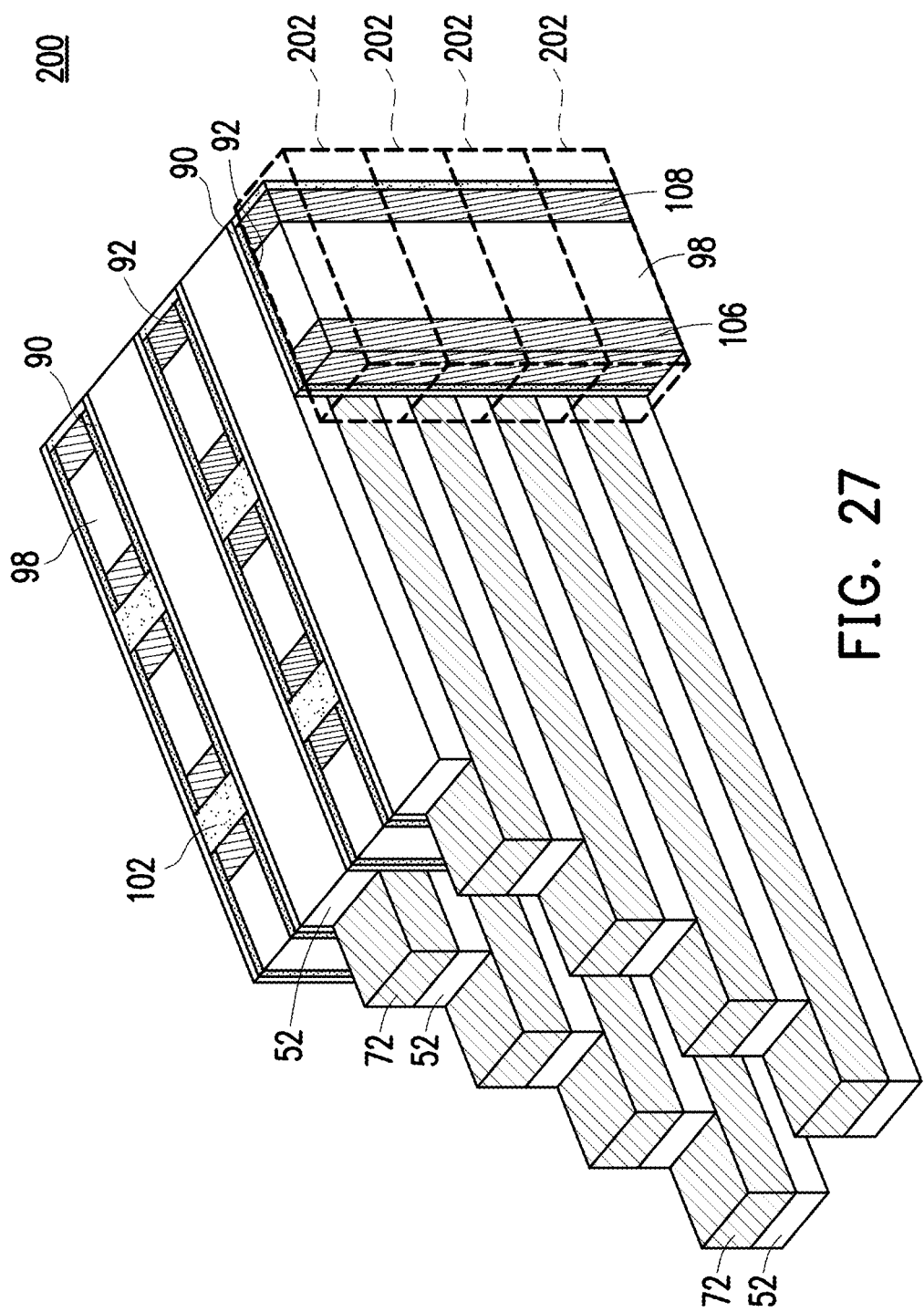
FIG. 27 illustrates a simplified perspective view of a memory device in accordance with alternative embodiments.

Although the embodiments of FIGS. 1A through 26 illustrate a particular pattern for the conductive pillars 106 and 108, other configurations are also possible. For example, in these embodiments, the conductive pillars 106 and 108 have a staggered pattern. However, in other embodiments, the conductive pillars 106 and 108 in a same row of the array are all aligned with each other, as shown in the memory device 200 of FIG. 27. In such embodiments, the widths of the conductive lines 116B and 116B are increased as the conductive lines 116B and 116B become far away from the side at which the drivers are disposed as described above for FIGS. 25C and 26.

In some embodiments of the disclosure, the memory device is single-sided driving or double-sided driving, in other words, the drivers may be disposed at one side or both sides of the staircase structure. In some embodiments of the disclosure, the widths of the conductive lines are increased as the conductive lines become far away from the side at which the drivers are disposed. Therefore, the resistance of the conductive lines is optimized, and the worst bit performance in the memory device such as 3D ferroelectric memory device is improved.

In the above embodiments, the memory device is formed by a "staircase first process" in which the staircase structure is formed before the memory cells are formed. However, the disclosure is not limited thereto. In other embodiments, the memory device may be formed by a "staircase last process" in which the staircase structure is formed after the memory cells are formed.

In the above embodiments, the gate electrodes (e.g., word lines) are formed by depositing sacrificial dielectric layers followed by replacing sacrificial dielectric layers with conductive layers. However, the disclosure is not limited thereto. In other embodiments, the gate electrodes (e.g., word lines) may be formed in the first stage without the replacement step as needed.

Many variations of the above examples are contemplated by the present disclosure. It is understood that different embodiments may have different advantages, and that no particular advantage is necessarily required of all embodiments.

In accordance with some embodiments of the present disclosure, a memory device includes a multi-layer stack. The multi-layer stack is disposed on a substrate and includes a plurality of first conductive lines and a plurality of dielectric layers stacked alternately, wherein each of the plurality of first conductive lines has a first side and a second side opposite to the first side. The memory device further includes a plurality of second conductive lines crossing over the plurality of first conductive lines, wherein widths of the plurality of second conductive lines are increased as the plurality of second conductive lines become far away from the first side.

In accordance with alternative embodiments of the present disclosure, a memory device includes a multi-layer stack. The multi-layer stack includes a plurality of first conductive lines and a plurality of dielectric layers stacked alternately. The multi-layer stack includes a memory region and a first staircase region and a second staircase region disposed on opposite sides of the memory region. The memory device further includes a plurality of second conductive lines over the plurality of first conductive lines in the memory region, wherein widths of the plurality of second conductive lines are increased as the plurality of second conductive lines become close to a middle of the memory region.

In accordance with yet alternative embodiments of the present disclosure, a memory device includes a staircase structure. The staircase structure includes a plurality of first conductive lines and a plurality of dielectric layers stacked alternately, and the staircase structure includes a memory region and a first staircase region aside the memory region. The memory device further includes a plurality of second conductive lines over the plurality of first conductive lines in the memory region, wherein widths of the plurality of second conductive lines are increased as the plurality of second conductive lines become far away from the first staircase region.

In accordance with yet alternative embodiments of the present disclosure, a memory device includes a multi-layer stack including a plurality of first conductive lines and a plurality of second conductive lines. The first conductive lines are stacked on one another. The second conductive lines cross over the plurality of first conductive lines, wherein widths of the plurality of second conductive lines are increased as the plurality of second conductive lines become close to a middle portion of the multi-layer stack.

In accordance with yet alternative embodiments of the present disclosure, a memory device includes a multi-layer stack including a plurality of first conductive lines and a plurality of second conductive lines. The first conductive lines are stacked on one another, and the multi-layer stack includes a memory region. The second conductive lines are disposed over the plurality of first conductive lines in the memory region, wherein widths of the plurality of second conductive lines are increased as the plurality of second conductive lines become close to a middle portion of the memory region.

In accordance with yet alternative embodiments of the present disclosure, a memory device includes a staircase structure including a plurality of first conductive lines and a plurality of second conductive lines. The first conductive lines are stacked on one another, and the staircase structure includes a first region and a second region. The second conductive lines are disposed over the plurality of first conductive lines and disposed in the first region, wherein widths of the plurality of second conductive lines are increased as the plurality of second conductive lines become close to the second region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   a multi-layer stack, comprising a plurality of first conductive lines stacked on one another and each extending along a first direction; and
   a plurality of second conductive lines arranged in the first direction and at a first level above the plurality of first conductive lines, wherein the plurality of second conductive lines are each extending along a second direction perpendicular to the first direction, and widths of the plurality of second conductive lines are increased as the plurality of second conductive lines become close to a middle portion of the first level along the first direction.

2. The device of claim 1 further comprising a plurality of conductive contacts electrically connected to the first conductive lines, wherein the plurality of conductive contacts are disposed at both sides of the first conductive lines.

3. The device of claim 1, wherein a plurality of spacings formed between the plurality of second conductive lines are decreased as the plurality of spacings become close to the middle portion of the first level.

4. The device of claim 1, wherein a plurality of spacings formed between the second conductive lines are substantially the same.

5. The device of claim 1 further comprising a plurality of dielectric pillars disposed on the substrate and penetrating through the multi-layer stack, wherein the plurality of dielectric pillars have a plurality of first conductive pillars and a plurality of second conductive pillars disposed at two ends thereof respectively, the plurality of first conductive pillars are electrically connected to first ones of the plurality of second conductive lines, and the plurality of second conductive pillars are electrically connected to second ones of the plurality of second conductive lines.

6. The device of claim 1, wherein the multi-layer stack further comprises a plurality of dielectric layers, and the first conductive lines and the dielectric layers are alternately stacked.

7. A device, comprising:
   a multi-layer stack, comprising a plurality of first conductive lines stacked on one another and each extending along a first direction, the multi-layer stack comprising a memory region; and
   a plurality of second conductive lines arranged in the first direction and at a first level above the plurality of first conductive lines in the memory region, wherein the plurality of second conductive lines are each extending along a second direction perpendicular to the first direction, and widths of the plurality of second conductive lines are increased as the plurality of second conductive lines become close to a middle portion of the first level along the first direction.

8. The device of claim 7 further comprising a plurality of first conductive contacts electrically connected to first ends of the first conductive lines and a plurality of second conductive contacts electrically connected to second ends of the first conductive lines.

9. The device of claim 7, wherein two of the plurality of second conductive lines opposite to each other with respect to the middle portion have substantially the same widths.

10. The device of claim 7 further comprising a plurality of dielectric pillars, a plurality of first conductive pillars and a plurality of second conductive pillars, wherein the plurality of dielectric pillars penetrate through the multi-layer stack in the memory region, and the plurality of first conductive pillars and the plurality of second conductive pillars are disposed at two ends of the plurality of dielectric pillars, respectively.

11. The device of claim 10, wherein the plurality of second conductive lines electrically connected to the plurality of first conductive pillars are bit lines, and the plurality of second conductive lines electrically connected to the plurality of second conductive pillars are source lines.

12. The device of claim 7, wherein the multi-layer stack further comprises a plurality of dielectric layers, and the first conductive lines and the dielectric layers are alternately stacked.

13. The device of claim 7 further comprising:
   a channel layer in the memory region, penetrating through the plurality of first conductive layers and the plurality of dielectric layers; and
   a memory material layer in the memory region, disposed between the channel layer and each of the plurality of first conductive layers and the plurality of dielectric layers.

14. A device, comprising:
   a staircase structure, including a plurality of first conductive lines stacked on one another and each extending along a first direction, the staircase structure comprising a first region, a second region and a third region arranged sequentially along the first direction; and
   a plurality of second conductive lines arranged along the first direction at a first level above the plurality of first conductive lines in the first region and the third region, wherein the plurality of second conductive lines are each extending along a second direction perpendicular to the first direction, and widths of the plurality of second conductive lines are increased as the plurality of second conductive lines become close to the second region.

15. The device of claim 14, wherein the staircase structure further comprises a first staircase region, and the first region is disposed between the first staircase region and the second region.

16. The device of claim 15, wherein the staircase structure further comprises a second staircase region, and the third region is disposed between the second staircase region and the second region.

17. The device of claim 16 further comprising a plurality of first conductive contacts and a plurality of second conductive contacts, wherein the first conductive contacts are in direct contact with the first conductive lines in the first staircase region respectively, and the second conductive contacts are in direct contact with the first conductive lines in the second staircase region respectively.

18. The device of claim 14, wherein the nearest one of the plurality of second conductive lines to the second region has a first width, the farthest one of the plurality of second conductive lines to the second region has a second width, and a ratio of the second width to the first width is in a range of about 5 to about 20.

19. The device of claim 14, wherein the first region and the third region are respectively a memory region.

20. The device of claim 14 further comprising a memory material layer and a channel layer covering a sidewall of the staircase structure, wherein the channel layer is disposed between the memory material layer and the staircase structure.

* * * * *